(12) United States Patent
Ferrari et al.

(10) Patent No.: US 12,176,470 B2
(45) Date of Patent: Dec. 24, 2024

(54) MICRO LIGHT EMITTING DIODES WITH NANOHOLE GRATING FOR HIGH SPEED, HIGH EFFICIENCY APPLICATIONS

(71) Applicant: The Regents of the University of California, Oakland, CA (US)

(72) Inventors: Lorenzo Ferrari, Portland, OR (US); Zhaowei Liu, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 472 days.

(21) Appl. No.: 16/994,391

(22) Filed: Aug. 14, 2020

(65) Prior Publication Data

US 2021/0050494 A1 Feb. 18, 2021

Related U.S. Application Data

(60) Provisional application No. 62/887,396, filed on Aug. 15, 2019.

(51) Int. Cl.
*H01L 33/58* (2010.01)
*H01L 33/06* (2010.01)
(Continued)

(52) U.S. Cl.
CPC .............. *H01L 33/58* (2013.01); *H01L 33/06* (2013.01); *H01L 33/32* (2013.01); *H01L 33/62* (2013.01);
(Continued)

(58) Field of Classification Search
CPC ......... H01L 33/58; H01L 33/06; H01L 33/32; H01L 33/62; H01L 2933/0083;
(Continued)

(56) References Cited

U.S. PATENT DOCUMENTS

2010/0054748 A1* 3/2010 Sato ................... H04B 10/1149
398/202
2011/0233514 A1* 9/2011 Lu ........................... H01L 33/20
257/13
(Continued)

OTHER PUBLICATIONS

Agrawal, G. P. "Fiber-Optic Communication Systems," 4th ed.; Wiley, 2010.
(Continued)

*Primary Examiner* — Ratisha Mehta
(74) *Attorney, Agent, or Firm* — Mintz Levin Cohn Ferris Glovsky and Popeo, P.C.

(57) ABSTRACT

A light emitting diode may include a light emission layer and a charge transport layer disposed on the light emission layer. A grating including a plurality of nanoholes may be formed by removing a portion of the charge transport layer and/or the light emission layer and depositing a plasmonic metamaterial on a remaining portion of the charge transport layer and/or the light emission layer. The nanoholes may include the plasmonic metamaterial deposited inside the recesses formed by the remaining portion of the charge transport layer and/or the light emission layer, with an additional portion of the charge transport layer disposed on top. A pitch, diameter, and/or depth of the nanoholes may be configured to maximize the quantum efficiency of the light emitting diode, especially at a microscale of less than 100 microns.

19 Claims, 15 Drawing Sheets

(51) Int. Cl.
    H01L 33/32    (2010.01)
    H01L 33/62    (2010.01)
    G02B 5/00     (2006.01)
    G02B 5/18     (2006.01)
(52) U.S. Cl.
    CPC ............ *G02B 5/008* (2013.01); *G02B 5/1809* (2013.01); *H01L 2933/0083* (2013.01)
(58) Field of Classification Search
    CPC ......... H01L 33/14; H01L 33/24; G02B 5/008; G02B 5/1809; G02B 1/002
    See application file for complete search history.

(56)            References Cited

U.S. PATENT DOCUMENTS

2017/0179334 A1*  6/2017  Liu ................... H01L 51/5225
2019/0115492 A1*  4/2019  Tamma ................ H01L 33/20
2019/0172761 A1*  6/2019  Guo .................. H01L 22/22

OTHER PUBLICATIONS

Akselrod, G.M. et al., "Probing the Mechanisms of Large Purcell Enhancement in Plasmonic Nanoantennas." Nat. Photon. 2014, 8, 835-840.
Bachman, K.A. et al., "Spiral Plasmonic Nanoantennas as Circular Polarization Transmission Filters." Opt. Express 2012, 20, 1308-1319.
Bagheri, S. et al., "Fabrication of Square-Centimeter Plasmonic Nanoantenna Arrays by Femtosecond Direct Laser Writing Lithography: Effects of Collective Excitations on SEIRA Enhancement." ACS Photonics 2015, 2, 779-786.
Chen, H.-S. et al., "Surface Plasmon Coupled Light-Emitting Diode With Metal Protrusions Into P-GaN." Applied Physics Letters 2013, 102, 041108.
Coldren, L. A. et al., "Diode Lasers and Photonic Integrated Circuits," 2nd ed.; Wiley, 2012.
Djurišić, A. et al., "Novel Model for the Optical Function of GaN." Applied Physics A 2002, 74, 669-674.
Ferrari, L. et al., "Enhanced Spontaneous Emission Inside Hyperbolic Metamaterials." Opt. Express 2014, 22, 4301-4306.
Ferrari, L. et al., "Hyperbolic Metamaterials and Their Applications." Progress in Quantum Electronics 2015, 40, 1-40.
Galfsky, T. et al., "Active Hyperbolic Metamaterials: Enhanced Spontaneous Emission and Light Extraction." Optica 2015, 2, 62-65.
Galfsky, T. et al., "Broadband Enhancement of Spontaneous Emission in Two-Dimensional Semiconductors Using Photonic Hypercrystals." Nano Letters 2016, 16, 4940-4945.
Gong, C.-S.A. et al., "The High-efficiency LED Driver for Visible Light Communication Applications." Scientific Reports 2016, 6, 30991.
Han, D. et al., "Morphologies and Optical and Electrical Properties of InGaN/GaN Micro-Square Array Light-Emitting Diode Chips." Appl. Opt. 2018, 57, 2835-2840.
Hou, H.W. et al., "High Temperature Terahertz Detectors Realized by a GaN High Electron Mobility Transistor." Scientific Reports 2017, 7, 46664.
Jin, J. et al., "Generation and Detection of Orbital Angular Momentum via Metasurface." Scientific Reports 2016, 6, 24286.
Johnson, P. B. et al., "Optical Constants of the Noble Metals." Phys. Rev. B 1972, 6, 4370-4379.
Khan, L.U., "Visible Light Communication: Applications, Architecture, Standardization and Research Challenges." Digital Communications and Networks 2017, 3, 78-88.
Kong, D.-J. et al., "InGaN/GaN Microcolumn Light-Emitting Diode Arrays With Sidewall Metal Contact." Opt. Express 2013, 21, 22320-22326.
Krishnamoorthy, H.N.S. et al., "Topological Transitions in Metamaterials." Science 2012, 336, 205-209.
Kwon, M.-K. et al., "Surface-Plasmon-Enhanced Light-Emitting Diodes." Advanced Materials 2008, 20, 1253-1257.
Lau, E. K. et al., "Enhanced Modulation Bandwidth of Nanocavity Light Emitting Devices." Opt. Express 2009, 17, 7790-7799.
Lei, D.Y. et al., "Geometry Dependence of Surface Plasmon Polariton Lifetimes in Nanohole Arrays." ACS Nano 2010, 4, 432-438.
Liao, W.-C. et al., "Optimized Spiral Metal-Gallium-Nitride Nanowire Cavity for Ultra-High Circular Dichroism Ultraviolet Lasing at Room Temperature." Scientific Reports 2016, 6, 26578.
Liu, L. et al., "Design of GaN-Based Surface Plasmon LEDs to Enhance the Modulation Bandwidth and Light Output." Physica Status Solidi (c) 2016, 13, 283-288.
Lu, C.-H., et al., "Enhancement of Green Emission from InGaN/GaN Multiple Quantum Wells via Coupling to Surface Plasmons in a Two-Dimensional Silver Array." Advanced Functional Materials 2011, 21, 4719-4723.
Lu, D. et al., "Enhancing Spontaneous Emission Rates of Molecules Using Nanopatterned Multilayer Hyperbolic Metamaterials." Nat. Nano. 2014, 9, 48-53.
Okamoto, K. et al., "Surface-Plasmon-Enhanced Light Emitters based on InGaN Quantum Wells." Nat. Mater. 2004, 3, 601-605.
Pathak, P.H., et al., "Visible Light Communication, Networking, and Sensing: a Survey, Potential and Challenges." IEEE Communications Surveys Tutorials 2015, 17, 2047-2077.
Pimputkar, S., et al., "Prospects for LED Lighting." Nat. Photon. 2009, 3, 180-182.
Shalaginov, M.Y. et al., "Broadband Enhancement of Spontaneous Emission from Nitrogen-Vacancy Centers in Nanodiamonds by Hyperbolic Metamaterials." Applied Physics Letters 2013, 102, 173114.
Smalley, J.S.T. et al., "Luminescent Hyperbolic Metasurfaces." Nat. Commun. 2017, 8, 13793.
Sreekanth, K.V. et al., "Large Spontaneous Emission Rate Enhancement in Grating Coupled Hyperbolic Metamaterials." Scientific Reports 2014, 4, 6340.
Tanaka, A. et al., "Strong Geometrical Effects in Submillimeter Selective Area Growth and Light Extraction of GaN Light Emitting Diodes on Sapphire." Scientific Reports 2015, 5, 17314.
Van der Laan, J.D. et al., "Evolution of Circular and Linear Polarization in Scattering Environments." Opt. Express 2015, 23, 31874-31888.
Wang, X.H. et al., "Raman and Photoluminescence Characterization of Focused Ion Beam Patterned InGaN/GaN Multi-Quantum-Wells Nanopillar Array." Journal of Applied Physics 2011, 110, 093111.
Yu, C.L. et al., "Circular Polarized Lasing Characteristics in Metal/GaN Double-Spiral Nanowire Cavity." Conference on Lasers and Electro-Optics. 2017; p. STh1C.4.
Zhu, S.-C. et al., "Enhancement of the Modulation Bandwidth for GaN-Based Light-Emitting Diode by Surface Plasmons." Opt. Express 2015, 23, 13752-13760.

* cited by examiner

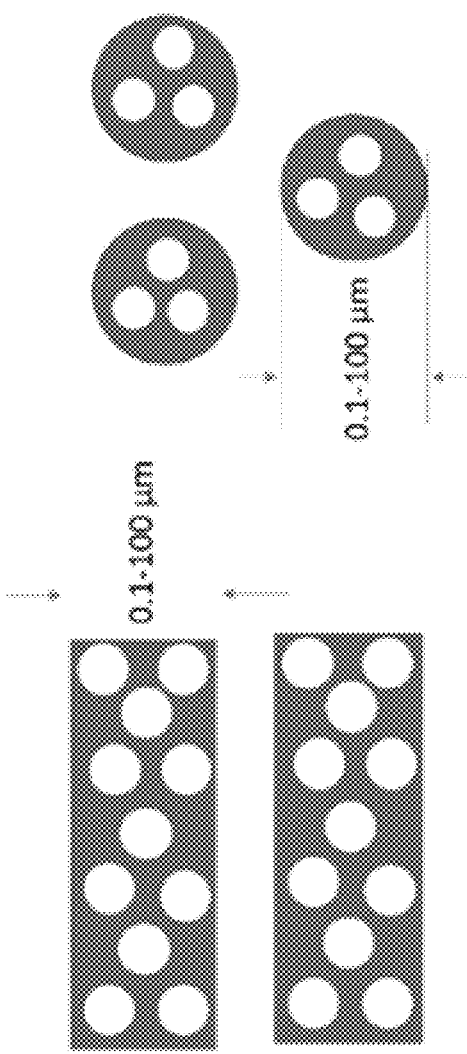

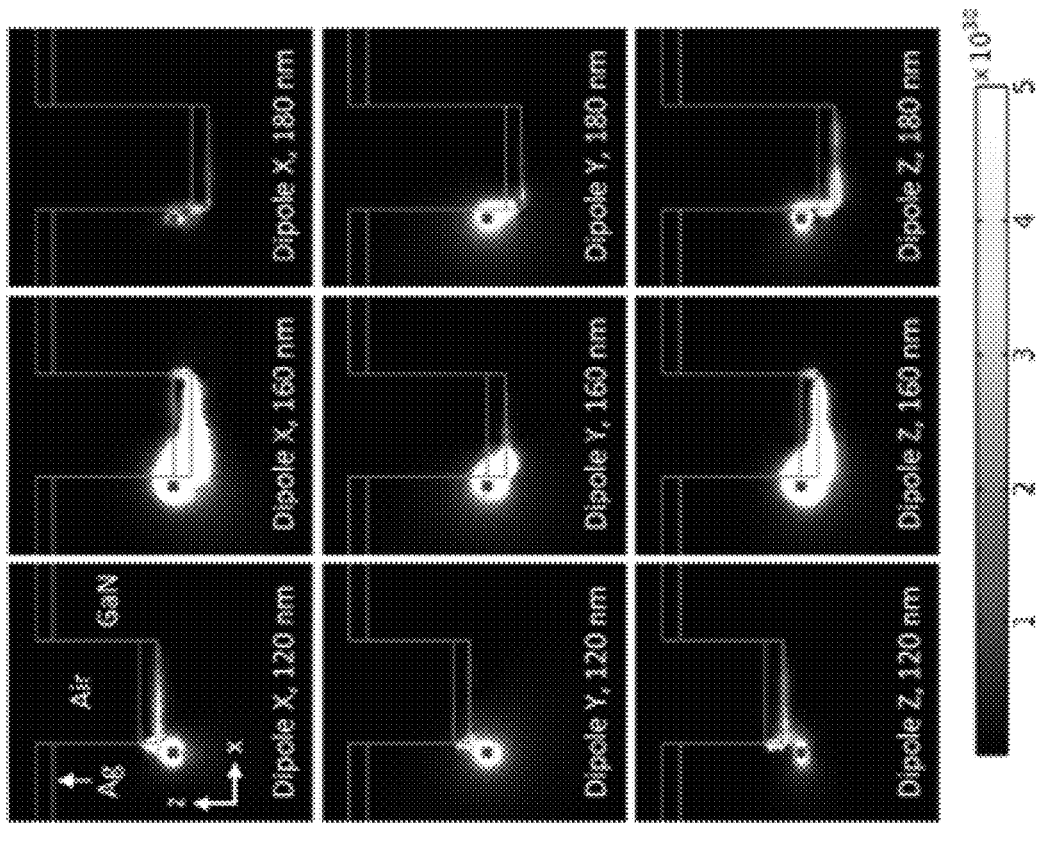
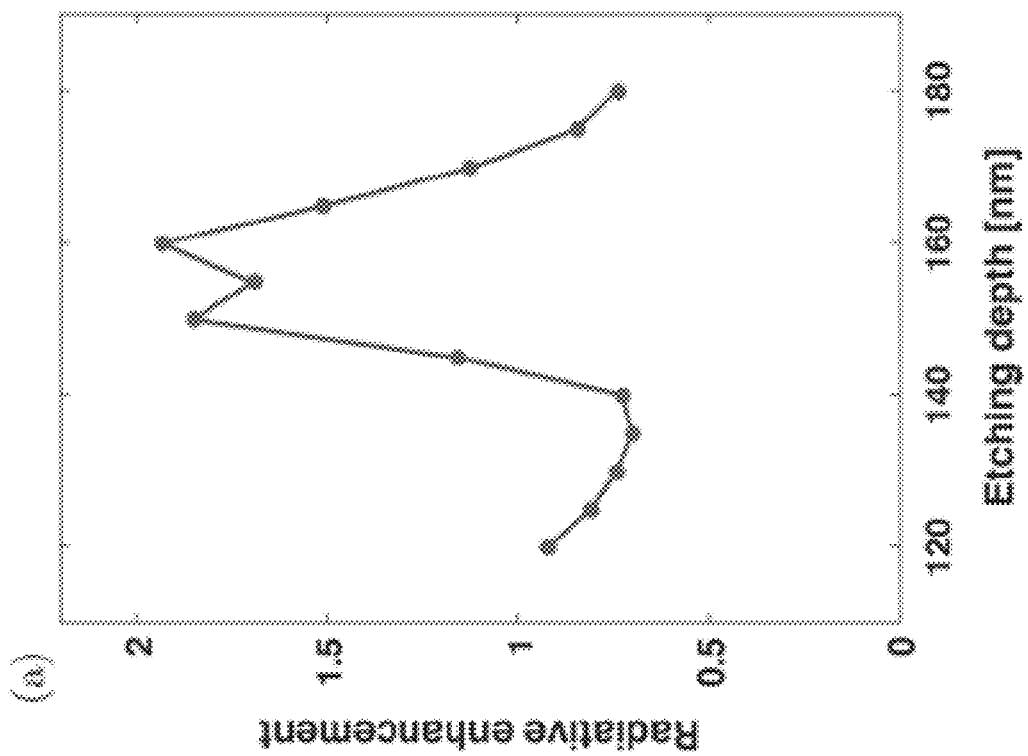
FIG. 11

MICRO LIGHT EMITTING DIODES WITH NANOHOLE GRATING FOR HIGH SPEED, HIGH EFFICIENCY APPLICATIONS

CROSS REFERENCE TO RELATED APPLICATION

This application claims priority to U.S. Provisional Application No. 62/887,396, filed on Aug. 15, 2019 and entitled "ULTRAFAST OPTICAL TRANSMITTER ARCHITECTURE," the disclosure of which is incorporated herein by reference in its entirety.

STATEMENT OF GOVERNMENT SUPPORT

This invention was made with government support under DMR1610538 awarded by the National Science Foundation. The government has certain rights in the invention. The Government has certain rights in the invention.

TECHNICAL FIELD

The present disclosure generally relates to optics and, more specifically, to light emitting diodes with optimal architecture for high speed, high efficiency applications.

BACKGROUND

A light emitting diode (LED) may be a p-n junction device formed by joining a p-type semiconductor doped to include excess holes and an n-type semiconductor doped to include excess electrons. The light emitting diode may emit light when an electric current is applied to the light emitting diode, which causes the excess electrons in the n-type semiconductor to recombine with the excess holes in the p-type semiconductor and release energy in the form of photons. The energy required for the excess electrons in the n-type semiconductor to cross the bandgap (e.g., energy gap) of the semiconductor material and become free to recombine with the excess holes in the p-type semiconductor may determine the color of the light emitted by the light emitting diode. For example, a light emitting diode formed a semiconductor material having a bandgap of 1.67 electron-volts (eV) may emit a red-colored light having a wavelength of between 625-760 nanometers.

SUMMARY

Systems, methods, and articles of manufacture are provided for micro light emitting diodes with nanohole grating. In one aspect, there is provided an apparatus that includes a micro light emitting diode. The apparatus may include: a light emission layer; a first charge transport layer disposed on the light emission layer; and a grating including a plurality of nanoholes formed by at least removing a portion of the first charge transport layer and depositing a plasmonic metamaterial on a remaining portion of the first charge transport layer, the plurality of nanoholes comprising one or more protrusions and recesses formed by the remaining portion of the first charge transport layer, and the plurality of nanoholes including the plasmonic metamaterial deposited on the remaining portion of the first charge transport layer.

In some variations, one or more of the features disclosed herein including the following features can optionally be included in any feasible combination. The plasmonic material may be a layer of a metal or a multilayer of the metal and at least one of a dielectric and a semiconductor.

In some variations, the light emitting diode may be an indium gallium nitride and gallium nitride (InGaN/GaN) light emitting diode in which the first charge transport layer includes gallium nitride (GaN) and the light emission layer includes indium gallium nitride (InGaN).

In some variations, a diameter, a pitch, and/or a depth of the plurality of nanoholes may be configured to optimize a quantum efficiency of the light emitting diode.

In some variations, the depth and the diameter of the plurality of nanoholes may have an aspect ratio of less than 1.5 to 1.

In some variations, the plurality of nanoholes may be patterned through the first charged transport layer to the light emission layer before being coated in the plasmonic metamaterial.

In some variations, the plasmonic metamaterial inside the plurality of nanoholes may be configured to horizontally overlap with the light emission layer.

In some variations, the light emitting diode may include a plasmonic region occupied by the plurality of nanoholes and an electronic region free from the nanoholes.

In some variations, a thickness of the first charge transport layer may be configured to preserve a diode behavior of the electronic region.

In some variations, the light emitting diode may be a transmitter in a visible light communication system.

In some variations, the light emitting diode may be less than 100 microns in size.

In some variations, the light emitting diode may be between 0.1 microns and 10 microns in size.

In some variations, the plurality of nanoholes may be further formed by removing a portion of the light emission layer and depositing the plasmonic metamaterial inside the recesses formed in the remaining portion of the light emission layer.

In some variations, the plurality of nanoholes may be further formed by depositing at least a portion of the first charge transport layer on top of the plasmonic metamaterial and the remaining portion of the light emission layer.

In some variations, the one or more protrusions and recesses may form one or more channels and/or indentations in the first charge transport layer and/or the light emission layer.

In some variations, the light emitting diode may further include a second charge transport layer, a buffer layer, and a substrate. The second charge transport layer may be disposed on the substrate. The buffer layer may be interposed between the light emission layer and the second charge transport layer.

In some variations, the light emitting diode may further include an isolation layer forming an interface between at least a portion of the plasmonic metamaterial, the first charge transport layer, the light emitting layer, and/or the second charge transport layer.

In some variations, the light emitting diode may further include one or more contacts and/or bonding pads.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to micro light emitting diodes, it should be readily understood that such features are not intended to be limiting. The claims that follow this disclosure are intended to define the scope of the protected subject matter.

DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

FIG. 5A depicts a top view of an example of a light emitting diode, in accordance with some example embodiments;

FIG. 5B depicts a top view of another example of a light emitting diode, in accordance with some example embodiments;

FIG. 5C depicts a top view of another example of a light emitting diode, in accordance with some example embodiments;

FIG. 11 depicts a simulated interaction between a quantum emitter and a silver (Ag) plasmonic grating in gallium nitride (GaN), in accordance with some example embodiments.

When practical, like labels are used to refer to same or similar elements in the drawings.

DETAILED DESCRIPTION

Figure 1A:
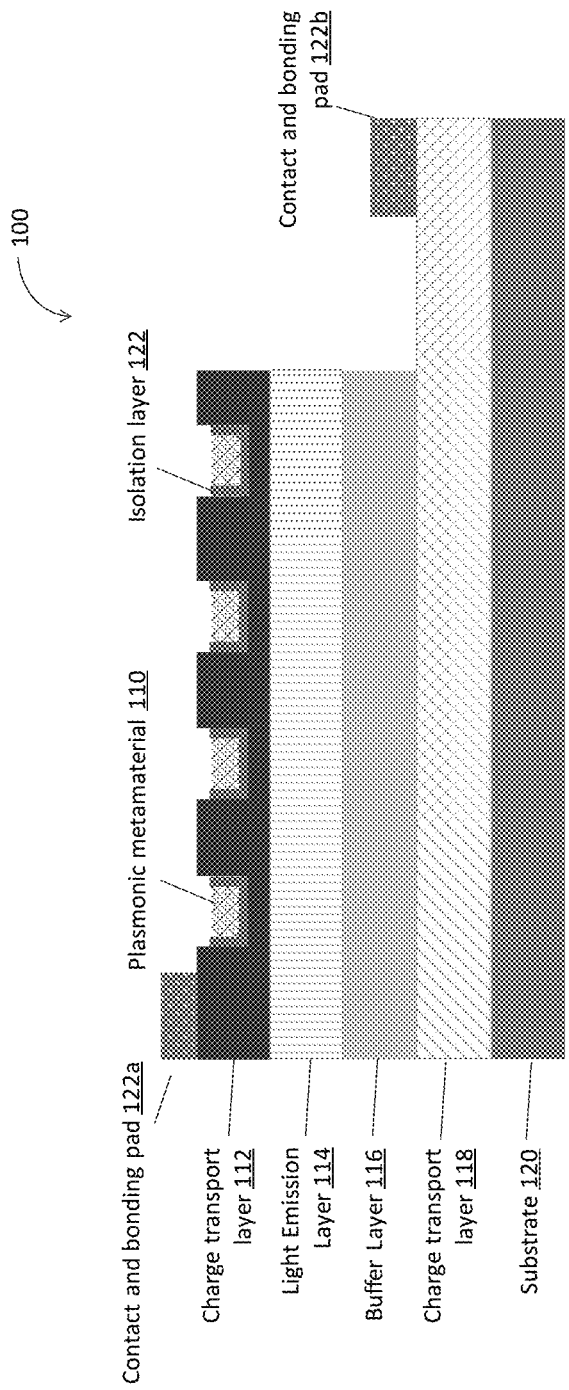
FIG. 1A depicts a cross sectional view of an example of a light emitting diode, in accordance with some example embodiments.

In order to serve as transmitters in visible light communication (VLC) systems, light emitting diodes (LEDs) may be required to operate with high speed and high efficiency while being microscale in size. Although a conventional light emitting diode may be scaled below 1 micron in size, the efficiency of a conventional light emitting diode is severely impacted by its size. That is, reducing the size of a conventional light emitting diode may significantly reduce its quantum efficiency. A conventional microscale light emitting diode may therefore consume more power in order to achieve the light intensity required for a light emitting diode display. As such, conventional light emitting diodes may be unsuitable for high speed, high efficiency applications such as visible light communication including, for example, chip-to-chip wireless communications, smart automotive lighting, wireless local area networks, underwater optical communications, and/or the like.

In some example embodiments, the speed and efficiency a light emitting diode, in particular a microscale light emitting diode that is less than 100 microns in size, may be optimized by including one or more nanostructures. For example, the light emitting diode may include a plasmonic metamaterial layer, a charge transport layer, and a light emission layer disposed on top of a substrate layer, with the one or more nanostructures being fabricated proximately to or in the light emission layer. For instance, a portion of the charge transport layer and/or the light emission layer may be removed such that a remaining portion of the charge transport layer and/or the light emission layer may include one or more protrusions and recesses including, for example, channels, indentations, and/or the like. The plasmonic metamaterial may be disposed on the remaining portion of the charge transport layer and/or the light emission layer including, for example, on top of the protrusions as well as in the recesses formed by the remaining portion of the charge transport layer and/or the light emission layer.

Each of the resulting nanostructures may include a portion of the plasmonic metamaterial and the charge transport layer as well as, in some instances, the light emission layer. Moreover, these nanostructures may serve as optical antennas configured to optimize the propagation of light from the light emission layer such that a maximum quantity of light from the light emission layer is projected outward, for example, as visible light output by the light emitting diode. This may be achieved, for example, by minimizing the quantity of light that is directed sideways towards the sidewall of the light emitting diode, where the light is quenched by the sidewall of the light emitting diode instead of being output as visible light. In doing so, the nanostructures may maximize the light intensity of the light emitting diode without requiring any additional power input into the light emitting diode.

In some example embodiments, the shape, dimension, placement, and distribution of these nanostructures may be configured to maximize the quantum efficiency of the light emitting diode such that the light emitting diode, even at a microscale (e.g., less than 100 microns in size) may achieve sufficient light intensity without consuming excessive power. For example, the shape, dimension, placement, and/or distribution of the nanostructures may be uniform across at least a portion of the light emitting diode. Alternatively, the shape, dimension, placement, and/or distribution of the nanostructures may vary across at least a portion of the entire light emitting diode or across regions of the light emitting diode. For instance, a first region of the light emitting diode may be occupied by nanostructures having a first material composition, a first shape, a first dimension, a first placement, and/or a first distribution. Meanwhile, a second region of the light emitting diode may not include any nanostructures or may be occupied by nanostructures having a second material composition, a second shape, a second dimension, a second placement, and/or a second distribution.

In some example embodiments, the speed and efficiency a light emitting diode, in particular a microscale light emitting diode that is less than 100 microns in size, may be optimized by including a nanohole grating. For example, an indium gallium nitride and gallium nitride (InGaN/GaN) light emitting diode may include a metal, for example, silver (Ag), nanohole grating. The light emitting diode with the nanohole grating may exhibit a 40-fold decrease in spontaneous emission lifetime, which indicates a modulation bandwidth in the gigahertz regime. Moreover, the configuration of the nanohole grating may be further optimized to provide a 10-fold increase in outcoupling efficiency relative to a flat plasmonic film. Accordingly, the light emitting diode with the nanohole grating may be especially suitable for high speed, high efficiency applications such as visible light communication (VCL).

FIG. 1A depicts a cross sectional view of an example of a light emitting diode 100, in accordance with some example embodiments. Referring to FIG. 1A, the light emitting diode may include a plurality of layers including, for example, a plasmonic metamaterial 110, a charge transport layer 112, and a light emission layer 114. As shown in FIG. 1A, the charge transport layer 112 or a spacer isolation layer may be interposed between the plasmonic metamaterial 110 and the light emission layer 114. Furthermore, the plasmonic metamaterial 110, the charge transport layer 112, and the light emission layer 114 may be disposed on top of a substrate 120, with an optional buffer layer 116 and another charge transport layer 118 interposed therebetween. The light emitting diode 100 may further include one or more contacts and/or bonding pads (e.g., a contact and a first bonding pad 122a, a second bonding pad 122b, and/or the like) for establishing an electrical connection with the light emitting diode 100.

In some example embodiments, the light emitting diode 100 may be a microscale light emitting diode that is less than 100 microns in size. For example, according to some example embodiments, the light emitting diode 100 may be between 0.1 microns and 10 microns. To optimize the quantum efficiency of the light emitting diode 100, the light emitting diode 100 may include one or more nanostructures that enable the light emitting diode 100 to achieve sufficient light intensity without consuming excessive power. The one or more nanostructures may be formed from protrusion and recesses (e.g., channels, indentations, and/or the like) formed into the plasmonic metamaterial 110 and the charge transport layer 112. Alternatively, the one or more nanostructures may be embedded into at least a portion of the charge transport layer 112 and/or the light emission layer 114. For instance, the light emitting diode 100 may be an indium gallium nitride and gallium nitride (InGaN/GaN) light emitting diode while the one or more nanostructures may be a nanohole grating formed from a metal such as silver (Ag).

In some example embodiments, the one or more nanostructures may be formed proximate to or, in some instances, into the light emission layer 114. Moreover, the shape, dimension, placement, and/or distribution of the nanostructures may be configured to optimize the quantum efficiency of the light emitting diode 100. As shown in FIG. 1A, the placement and/or distribution of the nanostructures may include a relative placement of two or more nanostructures (e.g., a distance between two or more adjacent nanostructures). The placement and/or distribution of the nanostructures may also include the distance between the plasmonic metamaterial 110 and the light emission layer 114 (e.g., a first distance $d_1$, a second distance $d_2$, a third distance $d_3$, and/or the like). An isolation layer 122 (e.g., having a thickness of a fourth distance $d_4$) may be disposed at least partially around the plasmonic metamaterial 110 to form an interface between the plasmonic metamaterial 110 and the charge transport layer 112 and/or the light emission layer 114.

In the example of the light emitting diode 100 shown in FIG. 1A, the one or more nanostructures may be formed proximate to the light emission layer 114. For example, as shown in FIG. 1A, a portion of the charge transport layer 112 may be removed such that the remaining portion of the charge transport layer 112 may include one or more protrusions and recesses including, for example, channels, indentations, wells, and/or the like. The plasmonic metamaterial 110 may be disposed inside the recesses such that each resulting nanostructure may include a portion of the plasmonic metamaterial 110 disposed in a recess within the charge transport layer 112 with the isolation layer 122 disposed therebetween. Moreover, the nanostructures may be disposed proximate to the light emission layer 114, for example, at a distance that is configured to maximize the outward projection of the light emitted by the light emission layer 114.

Figure 1B:
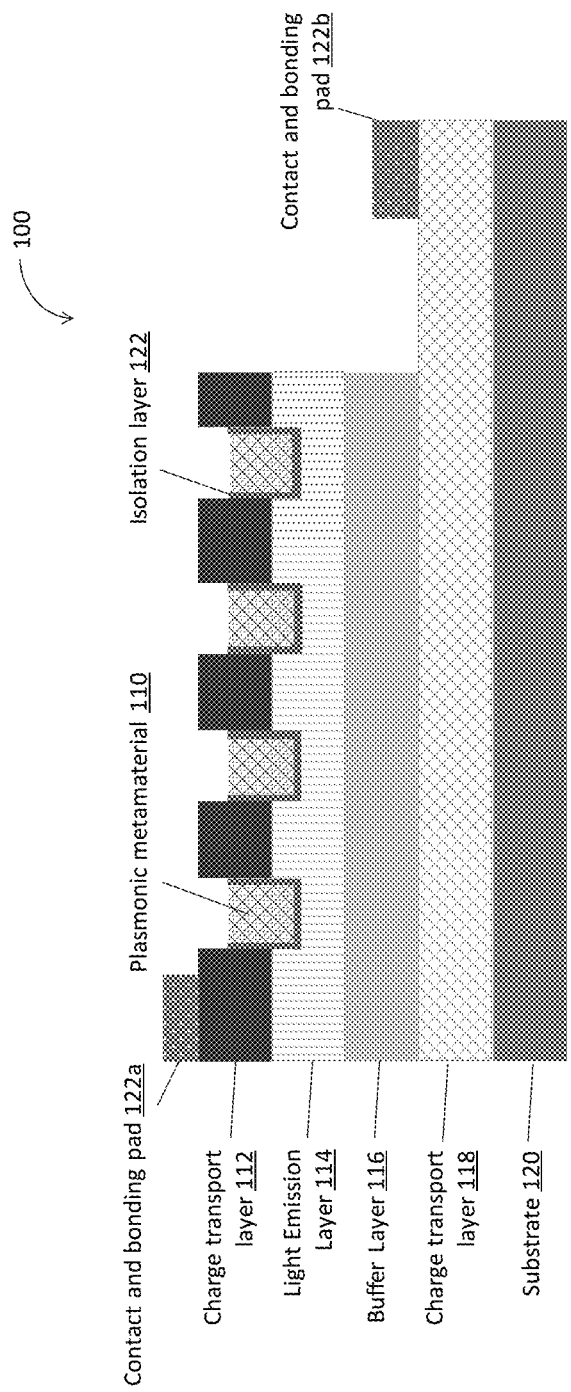
FIG. 1B depicts a cross sectional view of another example of a light emitting diode, in accordance with some example embodiments.

Alternatively, the one or more nanostructures may be fabricated into and/or to include the light emission layer 114. To further illustrate, FIG. 1B depicts a cross sectional view of another example of the light emitting diode 100, in accordance with some example embodiments. In the example of the light emitting diode 110 show in FIG. 1B, the one or more nanostructures are formed into the light emission layer 114, for example, at a depth corresponding to a fifth distance $d_5$, by removing a portion of the charge transport layer 112 as well as the light emission layer 114 underneath the charge transport layer 112. The remaining portion of the charge transport layer 112 and the light emission layer 114 may include one or more protrusions and recesses (e.g., channels, indentations, and/or the like). The plasmonic metamaterial 110 may be disposed inside the recesses formed into the charge transport layer 112 and the light emission layer 114, with the isolation layer 122 forming an interface between the plasmonic metamaterial 110 and the charge transport layer 112 and the light emission layer 114.

Figure 1C:
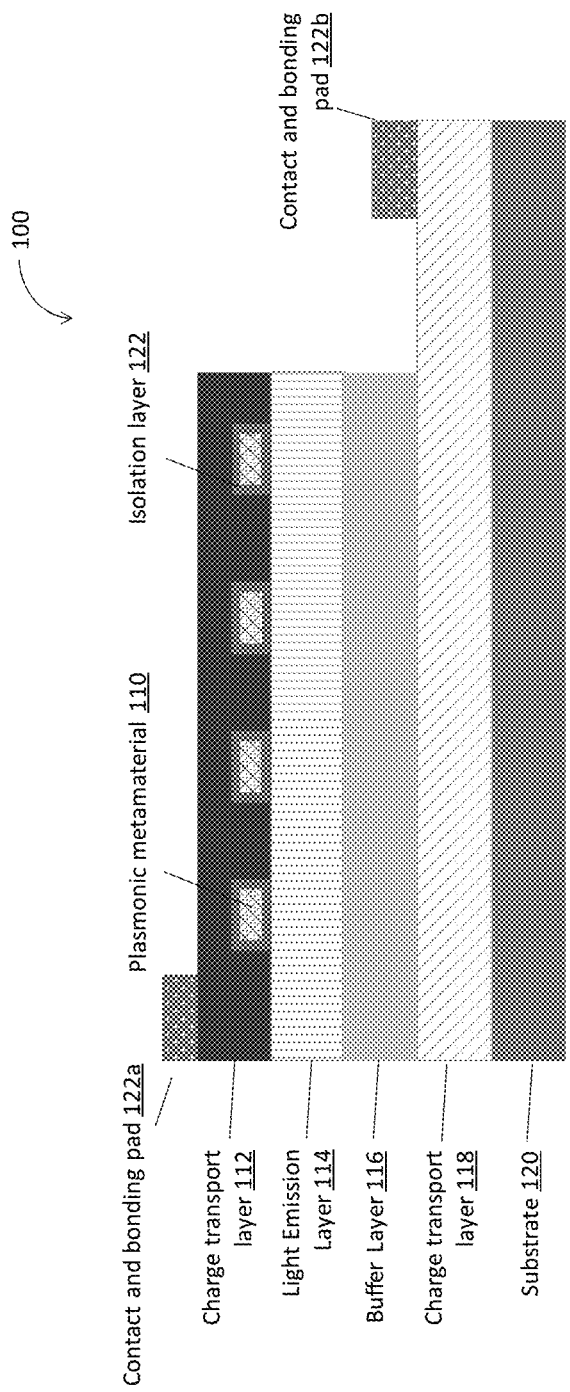
FIG. 1C cross sectional view of another example of a light emitting diode, in accordance with some example embodiments.
Figure 1D:
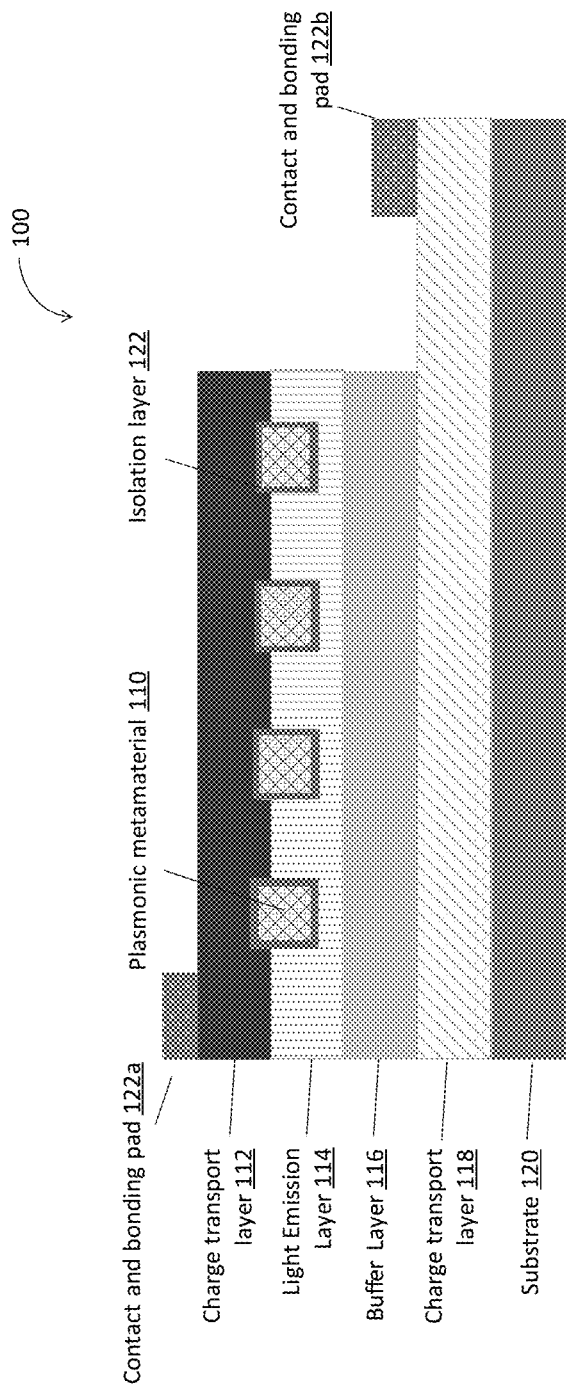
FIG. 1D cross sectional view of another example of a light emitting diode, in accordance with some example embodiments.

FIGS. 1C-D depict a cross sectional view of additional examples of the light emitting diode 100 in which the one or more nanostructures are embedded into the charge transport layer 112 and/or the light emission layer 114. In the example of the light emitting diode 100 shown in FIG. 1C, the one or more nanostructures may be formed by portions of the plasmonic metamaterial 110 embedded in the charge transport layer 112, with the isolation layer 122 forming an interface between each portion of the plasmonic metamaterial 110 and the charge transport layer 112 surrounding the plasmonic metamaterial 110. Alternatively, in the example of the light emitting diode 100 shown in FIG. 1D, the one or more nanostructures may be formed by portions of the plasmonic metamaterial 110 embedded into the charge transport layer 112 as well as the light emission layer 114 (e.g., at a depth corresponding to the fifth distance $d_5$). As shown in FIG. 1D, the isolation layer 112 may form an interface between each portion of the plasmonic metamaterial 110 and the charge transport layer 112 and/or the light emission layer 114 surrounding the plasmonic metamaterial 110.

In some example embodiments, the plasmonic metamaterial 110 may be structure that includes at least one of a dielectric or a metal. The plasmonic metamaterial 110 may exhibit superior sub-wavelength light focusing capability and density of states (DOS) modification capability at least because the electrons in the plasmonic metamaterial 110 may oscillate in response to excitons from the light emission layer 114. The nanostructures, which include portions of the plasmonic metamaterial 110, may provide a large density of states modification at selected oscillation frequency. The speed of which the nanostructures in the light emitting diode 100 may accept excitons from the light emission layer and output a photon of light is defined by Equation (1) below.

$$U_{modified} = F_p \times U_{unmodified} \quad (1)$$

wherein $U_{unmodified}$ may denote the emission rate prior to modification by the plasmonic metamaterial 110, $U_{modified}$ may denote the emission rate subsequent to modification by the plasmonic metamaterial 110, and $F_p$ may denote the Purcell factor quantifying the emission rate enhancement.

The Purcell factor $F_p$ may be determined by the optical density of state enhancement. In practice, the magnitude of the Purcell factor $F_p$ may be maximized by spectrum matching and spatial matching. Spectrum matching may be one key parameter for maximizing the Purcell factor $F_p$ at least because the density of state enhancement is wavelength dependent. As such, the amplitude of the Purcell factor $F_p$ may be wavelength dependent and may therefore be maximized when its peak matches the emission peak of the light emission layer 114.

Furthermore, maximizing the magnitude of the Purcell factor $F_p$ may also require spatial matching because the density of state enhancement may be confined to a small volume within distance (e.g., as short as ~40 nanometers for silver (Ag) on a gallium nitride (GaN) semiconductor at a 440 nanometer wavelength) while the enhancement amplitude may be inversely proportional to distance. Accordingly, the light emission layer 114 may be in proximity to the plasmonic metamaterial 110 in order for the nanostructures to maximize the quantity of light output by the light emitting diode 100, which in part requires a high magnitude $F_p$ indicative of the plasmonic metamaterial 110 turning excitons from the light emission layer 114 into light at an optimal speed.

Figure 7:
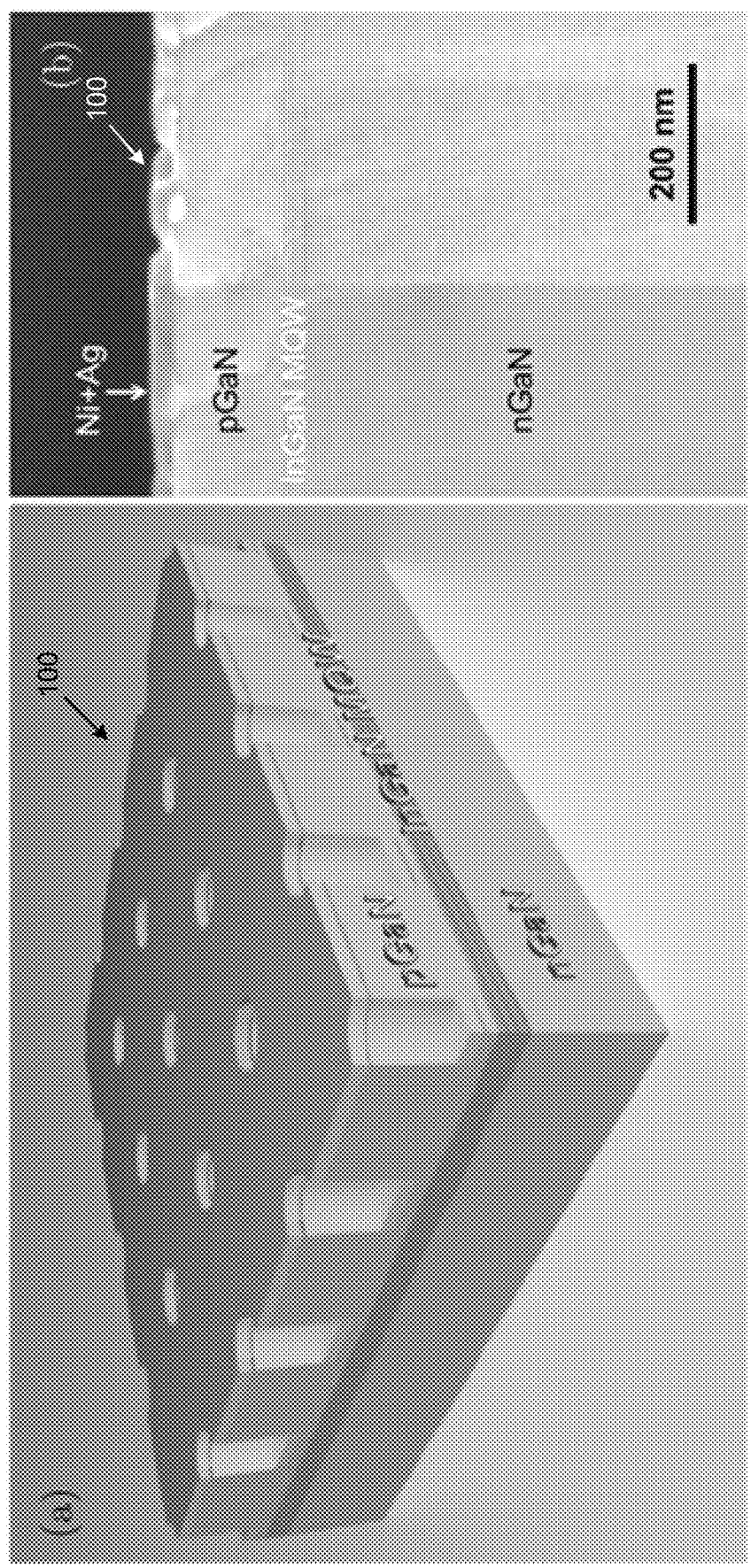
FIG. 7 depicts an example of an indium gallium nitride and gallium nitride (InGaN/GaN) light emitting diode with a silver (Ag) nanohole grating, in accordance with some example embodiments.

As noted, in some example embodiments, the light emitting diode 100 may be an indium gallium nitride and gallium nitride (InGaN/GaN) light emitting diode having a silver (Ag) nanohole grating. An example of the light emitting diode 100 that is an indium gallium nitride and gallium nitride (InGaN/GaN) light emitting diode with a silver (Ag) nanohole grating is shown in FIG. 7. FIG. 7(a) depicts a schematic diagram of the light emitting diode 100 having a nGaN base layer, three InGaN quantum well and GaN quantum barrier pairs, and a pGaN layer. A bilayer of nickel (Ni) and silver (Ag) may be deposited on the surface of the pGaN layer and inside the nanoholes. FIG. 7(b) depicts an ultrahigh resolution scanning electron microscope (UHR SEM) image of a cross section of the light emitting diode 100 in an area without the nanohole grating.

The example of the light emitting diode 100 shown in FIG. 7 may be fabricated by growing a gallium nitride (GaN) light emitting diode (LED) a double side polished (DSP) c-sapphire wafer using, for example, a close-coupled showerhead (CCS) metal-organic chemical vapor deposition (MOCVD) system. The light emitting diode structure, from the substrate upward, may include a 1 micron thick undoped gallium nitride (GaN) buffer layer and a 600 nanometer thick silicon (Si) doped nGaN layer ($N_D \approx 6 \times 10^{18}$ cm$^{-3}$), followed by 3 InGaN/undoped GaN (2 nm/10 nm) quantum well/quantum barrier (QB) layers. The light emission layer, for example, the multiple quantum well (MQW) active region of the light emission diode, may be capped with a magnesium (Mg) doped pGaN layer ($N_A \approx 5 \times 10^{17}$ cm$^{-3}$), whose thickness may vary across the wafer between 130 nanometers and 140 nanometers. The growth temperature of the indium gallium nitride (InGaN) layer may be adjusted to 730° C. to tune the emission wavelength to about 450 nanometers. The wafer may be annealed inside the metal-organic chemical vapor deposition (MOCVD) chamber at 750° C. under nitrogen ($N_2$) flow to activate the magnesium (Mg) dopants in the pGaN layer.

The growth wafer may subsequently be diced into 1×1 cm$^2$ samples and coated with a 10 nanometer thick sacrificial nickel (Ni) mask to protect the surface of the light emitting diode. Six 6 μm×6 μm gratings may be patterned on the light emitting diode with a focused ion beam (FIB) system with each grating including a 20×20 array of nanoholes. Each nanohole may have a pitch $p_h$ of 300 nanometers and a diameter $d_h$ of 120 nanometers. Moreover, the nanoholes may be etched with a gallium (Ga) ion beam at a voltage of 30 kilovolts and a current of 1.5 pico amperes. What differentiates the gratings may be the etching depth $d_{etch}$ of the nanoholes, which may vary from being smaller to being larger than the thickness $t_{pGaN}$ of the pGaN layer. Upon completing the patterning, the nickel (Ni) mask may be wet etched in nickel (Ni) etchant, and a 2-nanometer thick nickel (Ni) adhesion layer may be deposited on the grating followed by a 20-nanometer thick silver (Ag) plasmonic film using e-beam evaporation.

Configuring the light emitting diode 100 to be simultaneously capable of high speed and high efficiency operation may require reconciling a fundamental dichotomy between plasmonic and electronic requirements. For example, the near-field coupling between the multiple quantum well (MQW) emitting region and the pGaN/Ag interface, which supports surface plasmon polaritons (SPPs), may be maximized when the distance between the two is minimized. The distance between the multiple quantum well (MQW) emitting region and the pGaN/Ag interface, which may coincide with the thickness $t_{pGaN}$ of the pGaN layer thickness, should be shorter than the SP penetration depth in GaN, given by Equation (2) below.

$$t_{plas} = \frac{\lambda_0}{2\pi}\sqrt{\frac{\varepsilon'_{GaN} - \varepsilon'_{Ag}}{\varepsilon'^2_{GaN}}} \approx 37 \text{ nm} \quad (2)$$

wherein $\lambda_0$=450 nm, and $\varepsilon'_{GaN}$, $\varepsilon'_{Ag}$ may denote the real parts of the permittivity at $\lambda_0$ in the pGaN and Ag layers, respectively.

Contrastingly, to maintain proper electronic transport, the pGaN layer should be thicker than the p-side depletion width of the light emitting diode 100, as given by Equation (3) below.

$$t_{elec} = \sqrt{\frac{2\varepsilon'_{GaN} V_{bi} N_D}{q N_A (N_A + N_D)}} \approx 70 \text{ nm} \quad (3)$$

where $V_{bi}$=3.3 volts may be the built-in voltage, $N_D \approx 6 \times 10^{18}$ cm$^{-3}$, and $N_A \approx 5 \times 10^{17}$ cm$^{-3}$ may be the respective carrier concentrations in the nGaN and the pGaN, and q=1.6×10$^{-19}$ Coulombs may be the fundamental charge. The built-in voltage may be given by $V_{bi}=(k_B T/q)\ln[N_A N_D)/n_i^2]$, wherein $k_B T$=0.026 electronvolt (eV) at room temperature and $n_i \approx 2.25 \times 10^{-10}$ cm$^{-3}$ may be the intrinsic carrier concentration.

To circumvent this inherent conflict, nanoholes may be patterned through the pGaN layer to the multiple quantum well (MQW) region before being coated in a silver (Ag) film. Doing so may divide the light emitting diode 100 into two vertical volumes including, for example, a "plasmonic" one that is occupied by the nanoholes where the distance between the multiple quantum well (MQW) region and the nanopatterned silver (Ag) film may be subject to arbitrary control, and an "electronic" one that is free from nanoholes where diode behavior is preserved. Although such an architecture may enable a plasmonic-electronic trade-off, the geometry of the nanoholes may still require further optimization in order to maximize surface plasmon polaritons (SPP) excitation and outcoupling. The geometric parameters of the nanoholes that may be configured to control the interaction between the multiple quantum well region and the nanopatterned silver film may include the diameter $d_h$, the pitch $p_h$, and the depth $d_{etch}$ of the nanoholes forming the grating.

To understand the role of depth $d_{etch}$, six 6 μm×6 μm gratings having an identical diameter $d_h$=120 nm and pitch $d_h$=300 nm but varying depth $d_{etch}$ may be fabricated atop an InGaN/GaN light emitting diode chip with pGaN thickness $t_{pGaN}$=130-140 nm. The depth $d_{etch}$ of the gratings may be increased by a constant step from a value smaller than the pGaN thickness $t_{pGaN}$ to a value larger than the pGaN thickness $t_{pGaN}$ in an the approximate range of 100-200 nm. After nanohole milling, which may be accomplished via focused ion beam (FIB), a 2 nanometer nickel (Ni) adhesion layer followed by a 20 nanometer silver (Ag) layer may be deposited. Outcoupling may exhibit a non-monotonic dependence on the depth $d_{etch}$ of the gratings. In fact, the depth $d_{etch}$ of the gratings may be configured to maximize the excitation and far-field scattering of surface plasmon polaritons (SPP). The optimal efficiency of the resulting light emitting diode 100, combined with high-speed capability and sufficient pGaN thickness for diode behavior, renders the light emitting diode 100 especially suitable for visible light communication (VLC) applications.

Figure 2A:
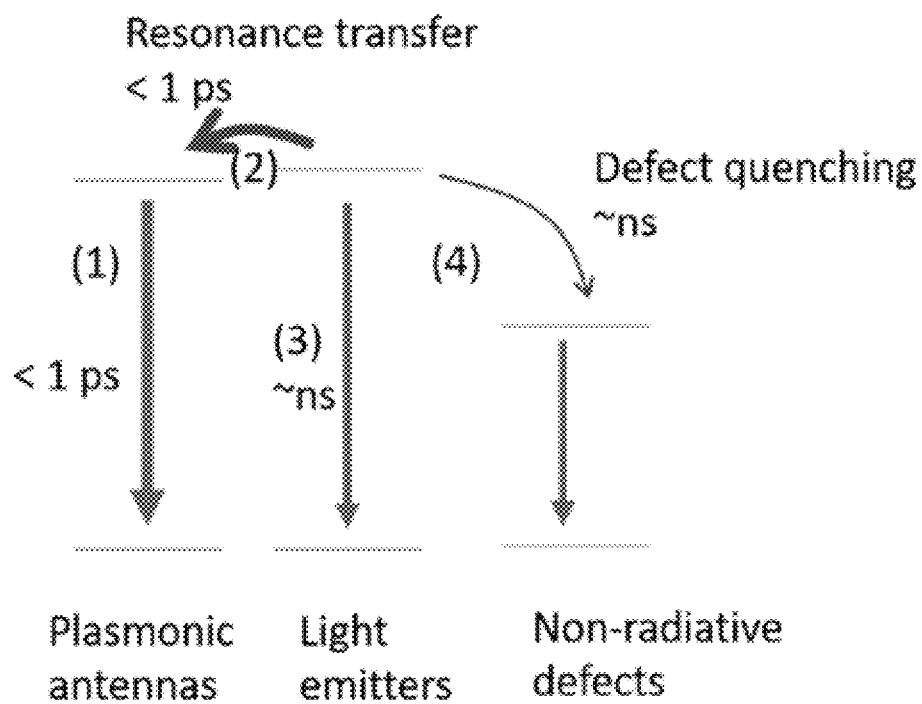
FIG. 2A depicts various recombination pathways in a light emitting diode, in accordance with some example embodiments.
Figure 2B:
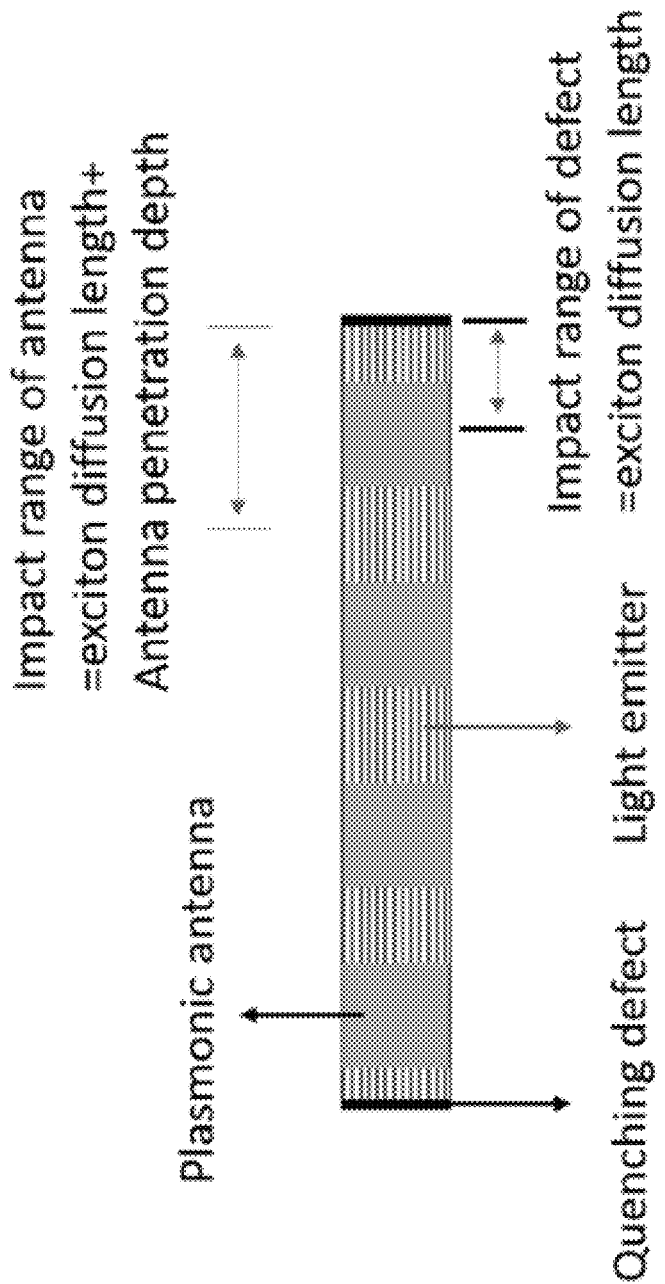
FIG. 2B depicts the impact range of a plasmonic metamaterial nanostructure relative to the impact range of sidewall surface defects, in accordance with some example embodiments.

FIG. 2A depicts various recombination pathways in the light emitting diode 100, in accordance with some example embodiments. In the examples of the light emitting diode 100 shown in FIGS. 1A-B, pathway (2) out the plasmonic metamaterial 110 may be overwhelming faster than pathway (3) through the light emission layer 114 and pathway (4) towards the sidewall of the light emitting diode 110. Accordingly, most of the decay may go through process (1), which may be very efficient with a radiative quantum efficiency from 10% to 90%, depending on the material and configuration of the plasmonic metamaterial 110, which may include the shape, dimension, placement, and distribution of the nanostructures formed to include portions of the plasmonic metamaterial 110. For example, as shown in FIG. 2B, the nanostructures may be placed within the distance of $d_{exciton\ diff}+d_{antenna}$ to the light emitter in the emission layer 114 and within the distance of $d_{exciton\ diff}$ to the sidewalls of the light emitting diode 100 where a quenching defect may be present.

Configured as such, the light emitting diode 100 may output light primarily through pathway (1) and may therefore retain 10-90% quantum efficiency. Moreover, the light emitting diode 100 may exhibit a higher outcoupling efficiency because the light emitting diode 100 may exhibit a strong scattering effect and may thus exhibit a similar external quantum efficiency at various sizes including, for example, at a microscale (e.g., less than 100 microns, between 0.1 microns and 10 microns, and/or the like). The fast decay rate of the light emitting diode 100 may further exhibit an inhibited efficiency roll-off at high current density, which has been a long-unresolved problem in high power light emitting diodes (e.g., gallium nitride (GaN) based light emitting diodes).

Figure 3A:
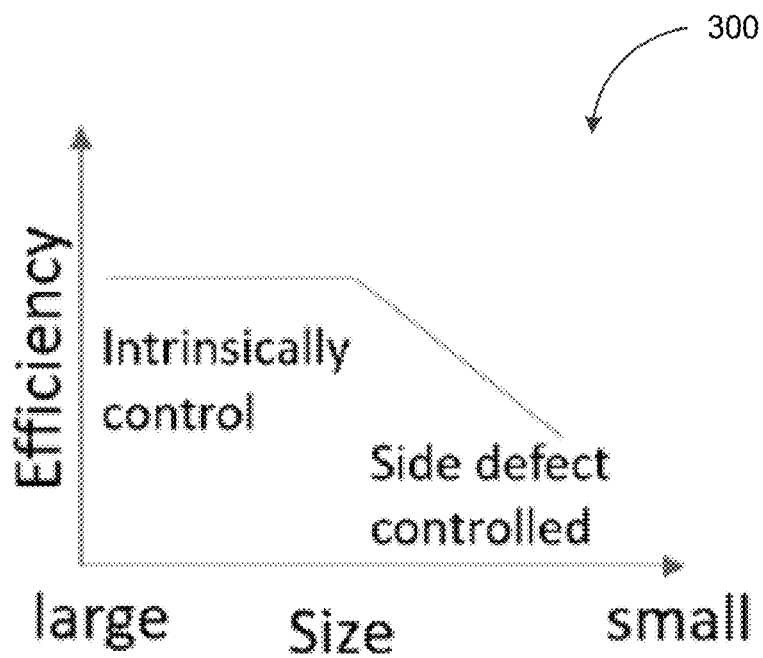
FIG. 3A depicts a graph illustrating a relationship between a size and a quantum efficiency of a conventional light emitting diode, in accordance with some example embodiments.
Figure 3B:
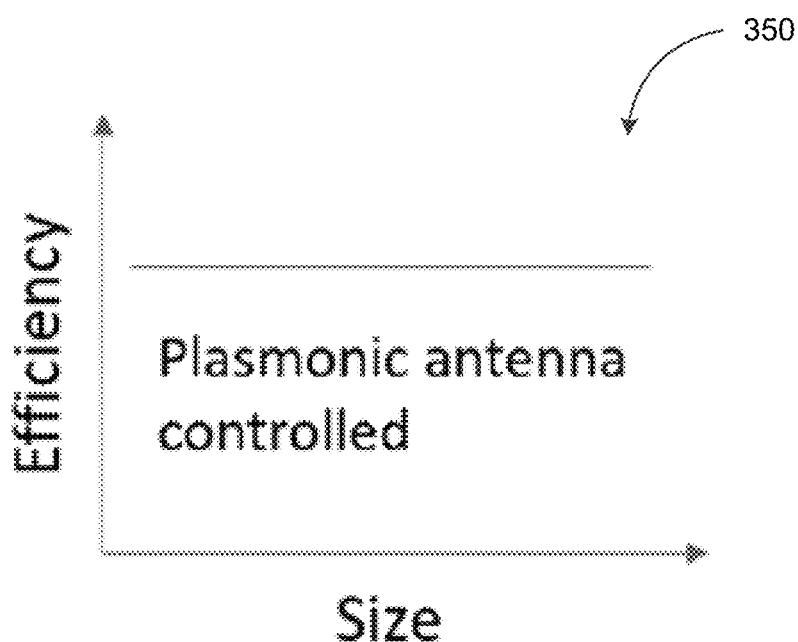
FIG. 3B depicts a graph illustrating a relationship between a size and a quantum efficiency of a light emitting diode having plasmonic metamaterial nanostructures, in accordance with some example embodiments.

To further illustrate, FIG. 3A depicts a graph 300 illustrating a relationship between the size and quantum efficiency of a conventional light emitting diode while FIG. 3B depicts a graph 350 illustrating a relationship between the size and quantum efficiency of a light emitting diode having plasmonic metamaterial nanostructures such as, for example, the light emitting diode 100. As shown in FIG. 3A, as the radius of a conventional light emitting diode approaches and goes below $d_{exciton\ diff}$, the conventional light emitting diode may exhibit a reduction in quantum efficiency. This reduction in quantum efficiency, which may be attributable to light being quenched by the sidewall of the light emitting diode instead of being projected outward, may be especially dramatic in a conventional microscale light emitting diode.

Contrastingly, as shown in FIG. 3B, the light emitting diode 100, which may have plasmonic metamaterial nanostructures covering the entire area of the light emitting diode 100, may exhibit minimal size and quantum efficiency dependency. Moreover, the quantum efficiency of the light emitting diode 100 may be high (e.g., approximately 80-90%) and remain high even as the size of the light emitting diode 100 drops below $d_{exciton\ diff}$.

In some example embodiments, the shape, dimension, placement, and distribution of the nanostructures included in the light emitting diode 100 may be configured to optimize the quantum efficiency of the light emitting diode 100 such that the light emitting diode 100, even at a microscale (e.g., less than 100 microns in size, between 0.1 microns and 10 microns in size, and/or the like) may achieve sufficient light intensity without consuming excessive power. For example, the shape, dimension, placement, and/or distribution of the nanostructures may be uniform across at least a portion of the entire light emitting diode 100. Alternatively, the material composition, shape, dimension, placement, and/or distribution of the nanostructures may vary across at least a portion of the light emitting diode 100 or across regions of the light emitting diode 100. For instance, a first region of the light emitting diode 100 may be occupied by nanostructures having a first material composition, a first shape, a first dimension, a first placement, and/or a first distribution. Meanwhile, a second region of the light emitting diode 100 may not include any nanostructures or the second region of the light emitting diode 100 may be occupied by nanostructures having a second material composition, a second shape, a second dimension, a second placement, and/or a second distribution.

Figure 4:
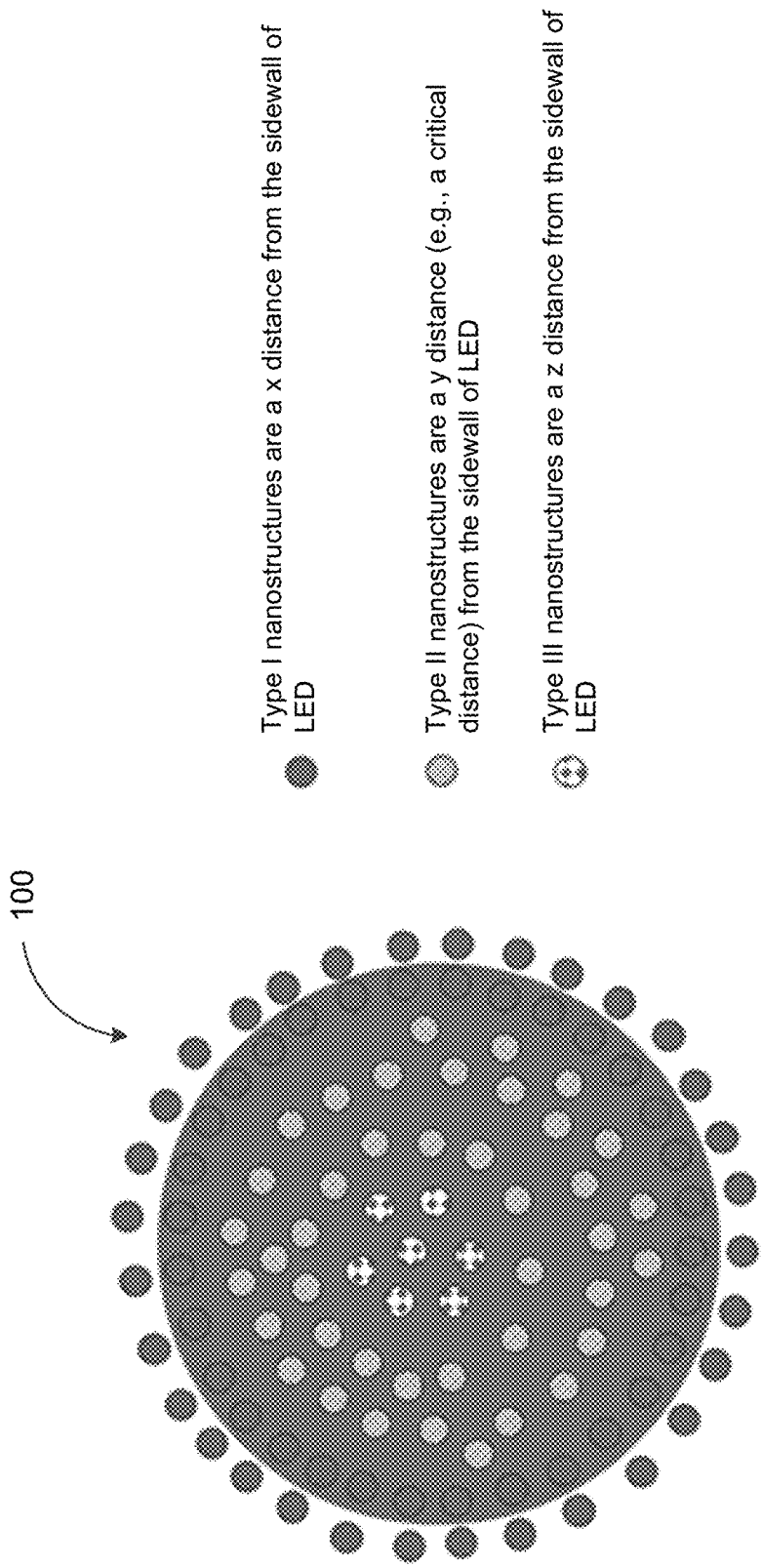
FIG. 4 depicts a top view of the light emitting diode having an example distribution of nanostructures, in accordance with some example embodiments.

FIG. 4 depicts a top view of the light emitting diode 100 having an example distribution of nanostructures, in accordance with some example embodiments. Referring to FIG. 4, the light emitting diode 100 may include one or more types of nanostructures, differentiated by a distance relative to the sidewall of the light emitting diode 100. For instance, in the example shown in FIG. 4, the light emitting diode 100 may include a first type of nanostructures that are an x distance away from the sidewall of the light emitting diode 100, a second type of nanostructures that are a y distance away from the sidewall of the light emitting diode 100, and a third type of nanostructures that are a z distance away from the sidewall of the light emitting diode 100. It should be appreciated that x<y<z and that y may be a critical distance such as, for example, one diffusion length, which may correspond to an average distance traveled by a carrier (e.g., an electron or an electron hole) in the semiconductor material forming the light emitting diode 100 between a generation of the carrier and a recombination of the carrier.

Referring again to FIG. 4, the first type of nanostructures that are an x distance away from the sidewall of the light emitting diode 100 may be adjacent to the sidewall of the light emitting diode 100. That is, the first type of nanostructures may be less than a threshold distance away from the sidewall of the light emitting diode 100 and may thus be required to compete with the quenching effects of the sidewall directly. As shown in FIG. 4, the first type of nanostructures may be disposed inside as well as outside of the sidewall of the light emitting diode 100. The quantum efficiency of the first type of nanostructures may be maximized in accordance with Equation (4) below, which includes maximizing the quantum efficiency of the light emitting diode at its sidewall $QE_{sidewall}$.

$$QE_{sidewall} = \frac{F_{p1} \times R_{rad} \times QE_{antenna_1}}{F_{p1} \times R_{rad} + R_{non-rad} + R_{quenching}} \quad (4)$$

wherein $R_{rad}$ may denote the radiative rate of the light emission layer 114, $R_{non-rad}$ may denote the non-radiative rate of the light emission layer 114, $R_{quenching}$ may denote the quenching rate of the sidewall of the light emitting diode 100, $F_p$ may denote the Purcell factor of the nanostructure, and $QE_{antenna}$ may denote the quantum efficiency of the nanostructure.

The second type of nanostructures may be disposed from side wall to a y distance away from the sidewall of the light emitting diode 100. While the second type of nanostructures are not adjacent to the sidewall of the light emitting diode 100 (e.g., y>x), the distance y may nevertheless be a critical distance such that the second type of nanostructures may maximize the emission of the carrier energies (e.g., as visible light) before the carrier energies are quenched by the sidewall of the light emitting diode. For example, the distance y may be one diffusion length, which may be approximately $$\frac{1}{R_{rad} + R_{non-rad}}.$$

Moreover, the quantum energy enhancement factor $Factor_{typeII}$ of the second type of nanostructures may be expressed by equation (5) below.

$$Factor_{typeII} = \frac{(L - L') \times QE_{antenna2} + L' \times QE_{sidewall}}{L \times QE_{sidewell}} \quad (5)$$

wherein L' may denote the modified diffusion length of the nanostructures, which may be approximately $$L' = \frac{1}{(F_{p2} \times R_{rad} + R_{non-rad})}.$$

The third type of nanostructures, being a z distance away from the sidewall of the light emitting diode 100, may be more than a single diffusion length away from sidewall (e.g., z>y>x). The third type of nanostructures may provide minimal contribution towards improving the quantum efficiency of the light emitting diode 100. In some example embodiments, the third type of nanostructures may be omitted altogether from the light emitting diode 100. However, it should be appreciated that the third type of nanostructures may be necessary for some applications and/or manufacturing processes. For example, the presence of these nanostructures, albeit relatively far away from the sidewall of the light emitting diode 100, may improve the emission uniformity of the light emitting diode 100 if these nanostructures have substantially the same level of emission as the other types of nanostructures in the light emitting diode 100. Accordingly, in cases where the light emitting diode 100 includes the third type of nanostructures, the third type of nanostructures should be configured to exhibit maximum quantum efficiency $QE_{antenna_3}$ while the Purcell factor $F_{p3}$ of the third type of nanostructures may be less critical.

In some example embodiments, optimizing the configuration of the nanostructures in the light emitting diode 100 may include prioritizing the optimization of those nanostructures that are closer to the sidewall of the light emitting diode 100. For example, optimizing the example of the light emitting diode 100 shown in FIG. 4 may include optimizing the first type of nanostructures to maximize the quantum efficiency of the sidewall $QE_{sidewall}$ before optimizing the quantum energy enhancement factor $Factor_{typeII}$ of the second type of nanostructures and the quantum efficiency $QE_{antenna_3}$ of the third type of nanostructures. It should be appreciated that the optimizations may extend to include some but not all of the types of nanostructures included in the light emitting diode 100. Moreover, the optimizations may be application specific and may extend beyond the geometric attributes (e.g., the shape, dimensions, placement, and distribution) of the nanostructures to include the composition of nanostructures and the light emitting diode 100 itself including, for example, the materials forming the nanostructures, the materials forming the light emitting diode 100, the thickness of the layers of the light emitting diode 100, and/or the like. Various numerical optimizations may be applied including, for example, Monte Carlo simulations, finite-difference time-domain methods (FDTD), and/or the like. Alternatively and/or additionally, the optimizations may be performed based on optical measurements such as, for example, photoluminescence measurements and/or the like.

In some example embodiments, the light emitting diode 100 may be configured to achieve a variety of form factors as shown in FIGS. 5A-C. For example, FIG. 5A depicts a rectangular shaped light emitting diode 100, FIG. 5B depicts a circular shaped light emitting diode 100, and FIG. 5C depicts an arbitrarily shaped light emitting diode 100. Regardless of form factor, the light emitting diode 100 may include the plasmonic metamaterial 110, which may be deposited on top of the charge transport layer 112 and the light emission layer 114. One or more nanostructures may be formed from the plasmonic metamaterial 110 and the charge transport layer 112 to be proximate to or in the light emission layer 114. These nanostructures may, as noted, serve as optical antennas that optimize the propagation of light from the light emission layer 114 such that a maximum quantity of light from the light emission layer 114 is projected outward, for example, as visible light output by the light emitting diode 100 while a minimum quantity of light from the light emission layer 114 is directed sideways towards the sidewall of the light emitting diode 100, where the light is quenched by the sidewall of the light emitting diode 100 instead of being output as visible light.

Figure 6A:
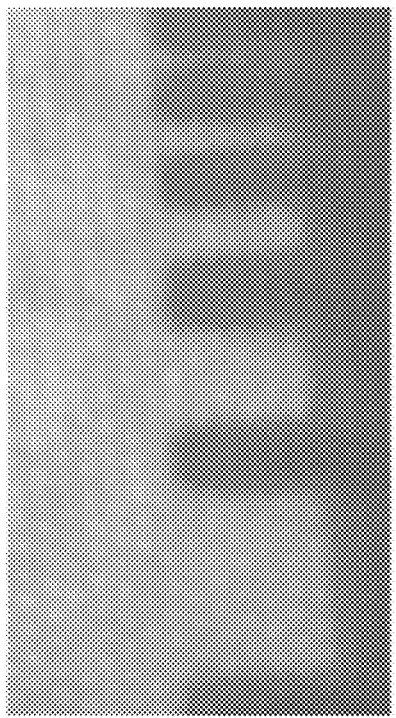
FIG. 6A depicts an optical microscopy image of conventional light emitting diodes, in accordance with some example embodiments.
Figure 6B:
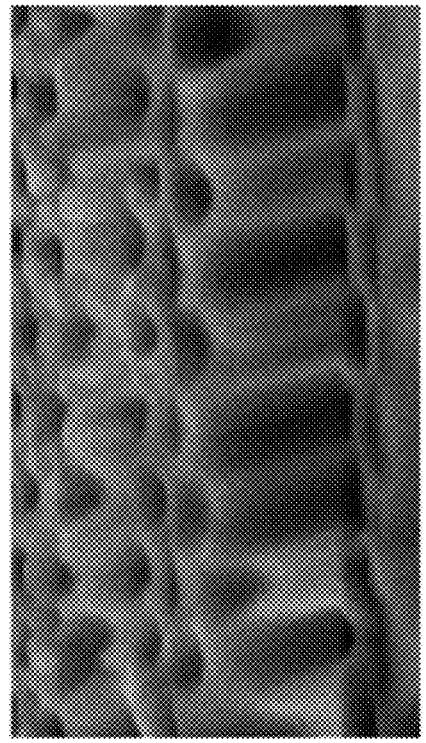
FIG. 6B depicts a camera mapping of a conventional light emitting diodes, in accordance with some example embodiments.
Figure 6C:
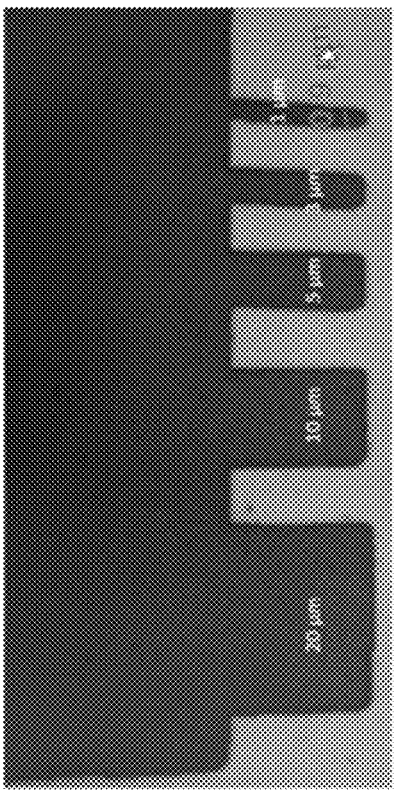
FIG. 6C depicts various microscale light emitting diodes prior to the deposition of plasmonic metamaterial nanostructures, in accordance with some example embodiments.
Figure 6D:
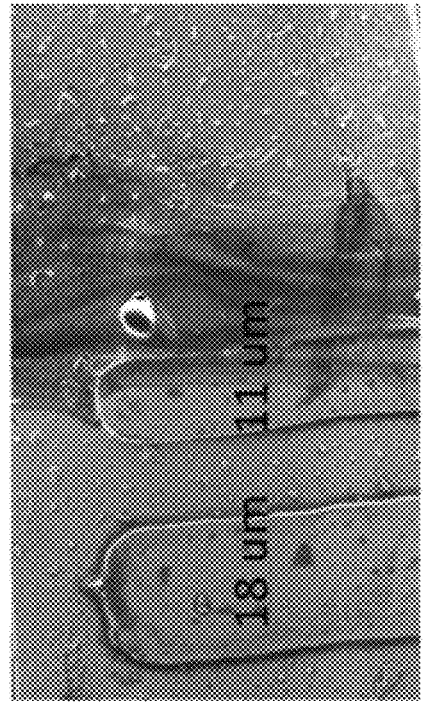
FIG. 6D depicts a cross sectional view of microscale light emitting diodes prior to deposition of plasmonic metamaterial nanostructures, in accordance with some example embodiments.

FIG. 6A depicts an optical microscopy image of conventional microscale light emitting diodes that are 20 microns, 10 microns, 5 microns, 3 microns, and 1 microns in size. When lit up, as depicted in the camera mapping shown in FIG. 6B, these conventional microscale light emitting diodes exhibit a noticeable decrease in light intensity when the size of the light emitting diodes decrease. FIG. 6C depicts an 18-micron light emitting diode and a 11-micron light emitting diode prior to the deposition of plasmonic metamaterial nanostructures. FIG. 6D depicts a cross sectional view of the 18-micron light emitting diode and the 11-micron light emitting diode prior to the deposition of plasmonic metamaterial nanostructures. As noted, the presence of plasmonic metamaterial nanostructures in microscale light emitting diodes may minimize the size-dependent quantum efficiency degradation associated with conventional microscale light emitting diodes.

Figure 8:
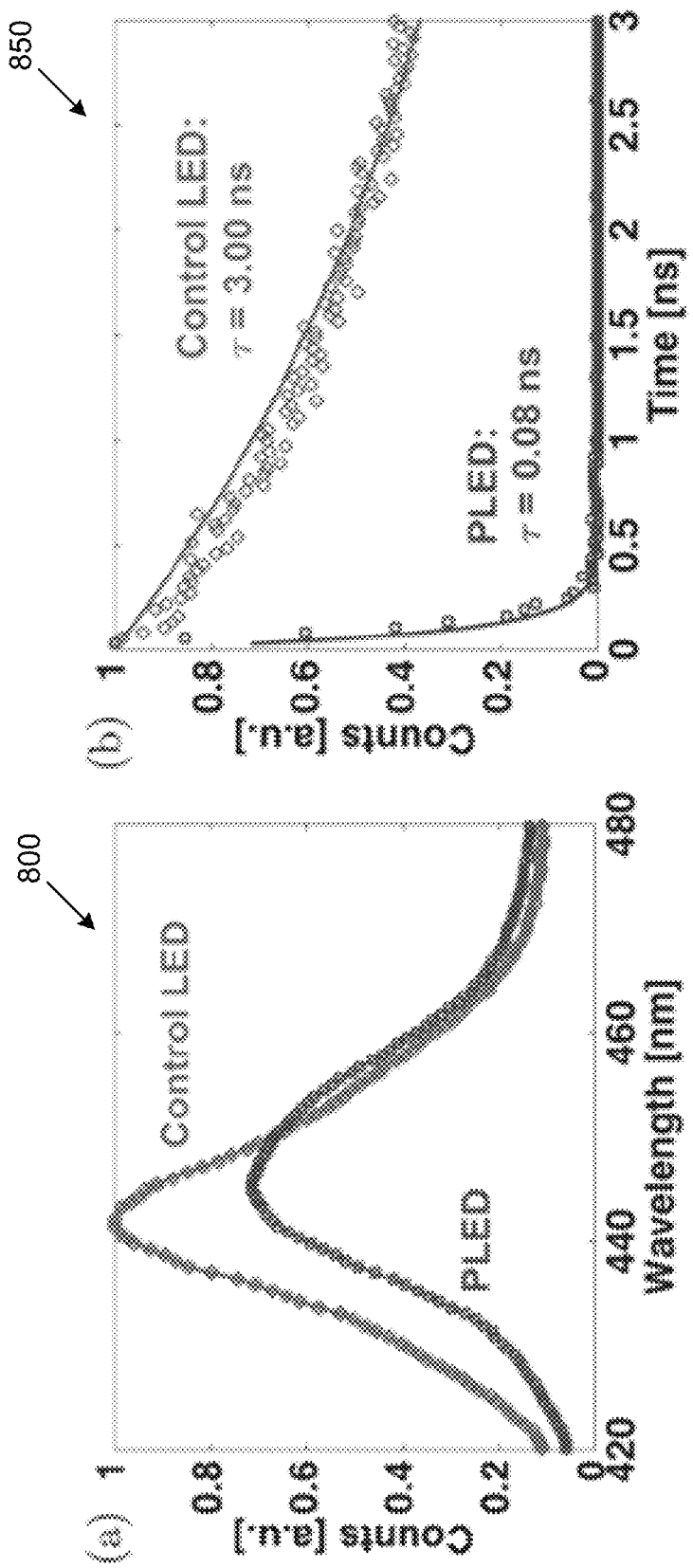
FIG. 8 depicts a comparison of a performance of a control light emitting diode and a performance of an indium gallium nitride and gallium nitride (InGaN/GaN) light emitting diode with a silver (Ag) nanohole grating, in accordance with some example embodiments.

The performance of an indium gallium nitride and gallium nitride (InGaN/GaN) light emitting diode with a silver (Ag) nanohole grating may be evaluated by at comparing a photoluminescence (PL) emission of the indium gallium nitride and gallium nitride (InGaN/GaN) light emitting diode with the silver (Ag) nanohole grating (PLED) against that of a control light emitting diode without nanostructure or metal. For example, FIG. 8(a) depicts a graph 800 illustrating a comparison of the photoluminescence spectra associated with the indium gallium nitride and gallium nitride (InGaN/GaN) light emitting diode with the silver (Ag) nanohole grating and that of the control light emitting diode without nanostructure or metal. FIG. 8(b) depicts a graph 850 illustrating a time-resolved photoluminescence at the vacuum wavelength $\lambda_0$=450 nm.

The photoluminescence spectra shown in FIG. 8(a) may be measured using a micro-photoluminescence system. The excitation light, generated by a mercury lamp, may be filtered at 405 nanometers and focused on the sample. The emitted light may be collected with an objective and spectrally analyzed by a spectrograph. For example, after entering a 20 micron aperture, radiation may be spatially separated by a blazed diffraction grating and detected with a charge-coupled device (CCD) camera. A dichroic beam splitter and a long-pass filter may ensure that the portion of the excitation light reflected off the sample is removed from the analyzed signal.

Spatially- and temporally-resolved photoluminescence may be measured by first illuminating the sample with a femtosecond titanium (Ti):sapphire laser having an 800-nanometer wavelength, an 80 megahertz repetition rate, and 100 femtosecond pulse width. Due to two-photon absorption, the sample may be fluoresced at wavelengths between 400 nanometers and 500 nanometers. Fluorescence at the emission wavelength of 450 nanometers may be collected through the bottom of the sample with a 20×, 0.45 NA objective before being sent to a monochromator for detection with an electrically cooled photomultiplier tube (PMT). The titanium (Ti):sapphire laser may be synchronized with a time-correlated single-photon detector providing 27-picosecond timing resolution. The beam position relative to the sample may be controlled by moving the sample stage with a two-axis piezoelectric motor with an 800-nanometer step size. Alignment of the pump beam and sample may be achieved with a microscope and a complementary metal-oxide-semiconductor (CMOS) camera (μEye).

Relative to the control light emitting diode, the photoluminescence emission of the indium gallium nitride and gallium nitride (InGaN/GaN) light emitting diode with the silver (Ag) nanohole grating (PLED) may exhibit a slight red-shift as well as a decrease in intensity. The red-shift may be attributed to small local variations in the structure and composition of the light emitting diode, which may give rise to an emission wavelength gradient of a few nanometers, as well as to local heating and to energy mismatch between multiple quantum well (MQW) emission and surface plasmon resonance. The intensity decrease may be traced to quenching effects, induced on the gallium nitride (GaN) surface by the nickel (Ni) hard mask strip off via nickel etchant. For the nanopatterned areas, another source of quenching may be surface damage caused by focused ion beam (FIB) milling. The kinetic energy transfer from the gallium ion ($Ga^+$) to the light emitting diode crystal lattice may generate a thin (e.g., approximately a few nanometers thick) damaged amorphous layer on the etched surface, which may be removed by post-focused ion beam wet etching in a heated potassium hydroxide (KOH) solution.

Because the photoluminescence peak of the indium gallium nitride and gallium nitride (InGaN/GaN) light emitting diode with the silver (Ag) nanohole grating (PLED) occurs at the vacuum wavelength $\lambda_0$=450 nm, this wavelength may be chosen detection wavelength for the spatiotemporally resolved photoluminescence characterization shown in FIG. 8(b). For example, a raster scan of the area occupied by the gratings may be performed with the photoluminescence lifetime and intensity being detected at each step. The lifetime values measured in the grating regions may be comparable for all gratings, regardless of the depth $d_{etch}$ of the gratings. This may indicate that, at $\lambda_0$=450 nm, the convolution of the different Purcell factor contributions, resulting from the interaction between the emitters space distribution and the metallic inclusions, yields a net Purcell factor that stays approximately constant across the depth $d_{etch}$ of the gratings. The pitch $p_h$ of the gratings, which remains identical across all gratings, may play a dominant role in controlling the lifetime reduction, whereas the depth $d_{etch}$ of the gratings may impact mainly the efficient outcoupling of surface plasmon polaritons (SPP) into the far field.

The representative decay curve of the indium gallium nitride and gallium nitride (InGaN/GaN) light emitting diode with the silver (Ag) nanohole grating (PLED) and that of the control light emitting diode are shown in FIG. 8(b). As shown in this comparison, the lifetime $\tau_{PLED}$ of the indium gallium nitride and gallium nitride (InGaN/GaN) light emitting diode with the silver (Ag) nanohole grating (PLED) exhibits a 40-fold shortening relative to the lifetime $\tau_{cont}$ of the control light emitting diode (e.g., $\tau_{PLED}$=0.08 nanoseconds versus $\tau_{cont}$=3 nanoseconds).

The relationship between measured photoluminescence lifetime to modulation bandwidth may be a complicated function that depends on the optical, electrical, and thermal properties of the light emitting diode, which are in turn influenced by the geometry and packaging of the light emitting diode. Nevertheless, the maximum modulation bandwidth may be determined through a rate equation model derived for cavity-based light emitting diodes. The frequency response H may be given by Equation (6) below.

$$H(\omega) = \frac{\Gamma}{\tau_c} = \frac{1}{\left(1 + \frac{i\omega}{\gamma_c}\right)\left(1 + \frac{i\omega}{\gamma sp}\right)} \quad (6)$$

wherein $\omega$ may denote the angular frequency ($\omega=2\pi f$) and $\Gamma$ may denote the modal confinement factor.

The cavity decay rate $\gamma_c=\tau_c^{-1}$ and the spontaneous decay rate $\gamma_{sp}=\tau_{sp}^{-1}=\gamma_{rad}+\gamma_{n-rad}$, wherein $\tau_c$ may denote the lifetime of photons in the cavity, $\tau_{sp}$ may denote the spontaneous emission lifetime, and $\gamma_{rad}$ and $\gamma_{n-rad}$ may denote the rates at which electron-hole pairs entering the active region recombine radiatively and non-radiatively. In the absence of a cavity, the quality factor $Q=\omega/\gamma$ may be determined by the natural linewidth of emission, which corresponds to the full-width at half-maximum (FWHM) of the photoluminescence spectra shown in FIG. 8(a). Further shown in FIG. 8(a), $\tau_c \approx [c/(430 \text{ nm} - c/(455 \text{ nm}))] = 3.9 \times 10^{-15}$ seconds, which is much smaller than $\tau_{sp}$ of the order of tens of picoseconds. Hence, the frequency response may be limited by $\gamma_{sp}$. Accordingly, the maximum 3 dB modulation bandwidth $f'_{3 dB}$ may be expressed as Equation (7) below.

$$f'_{3dB} = \max[f_{3dB}] = \frac{\sqrt{3}}{2\pi\tau_{eff}} \quad (7)$$

wherein $\tau_{eff}=\tau_{sp}/2.5$ may denote the differential carrier lifetime. The experimentally measured lifetimes imply that the indium gallium nitride and gallium nitride (InGaN/GaN) light emitting diode with the silver (Ag) nanohole grating (PLED) may achieve a 3 dB bandwidth of about 8.5 GHz. The modal confinement factors of the control light emitting diode and the indium gallium nitride and gallium nitride (InGaN/GaN) light emitting diode with the silver (Ag) nanohole grating are essentially identical, such that the $\Gamma$ term may have a negligible effect on the comparison.

Figure 9:
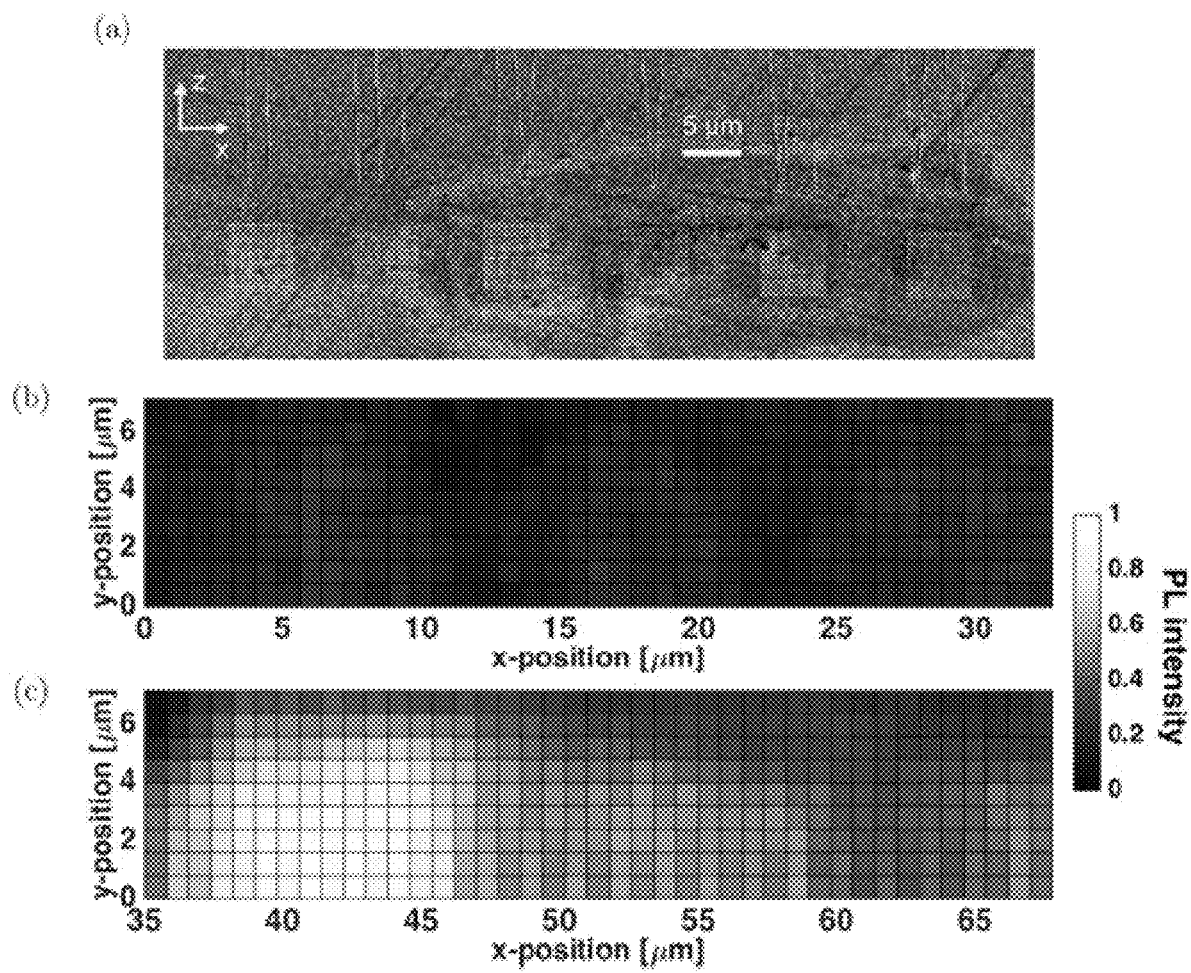
FIG. 9 depicts a spatial mapping of photoluminescence across nanohole gratings, in accordance with some example embodiments.

Maximizing the high-speed potential of the indium gallium nitride and gallium nitride (InGaN/GaN) light emitting diode with the silver (Ag) nanohole grating (PLED) may require effective light outcoupling. The impact of the depth $d_{etch}$ of the gratings on photoluminescence intensity may be assessed in order to identify an optimal extraction geometry. FIG. 9 depicts a spatial mapping of photoluminescence at the vacuum wavelength $\lambda_0=450$ nm for six nanohole gratings having various depths $d_{etch}$. For example, FIG. 9(a) depicts a scanning electron microscope (SEM) image of the six nanohole gratings, each milled with an increasing depth $d_{etch}$ from left to right. FIG. 9(b) depicts the spatially resolved photoluminescence intensity of gratings II-IV while FIG. 9(c) depicts the spatially resolved photoluminescence intensity of gratings V through VII. As shown I FIGS. 9(b)-(c), photoluminescence intensity may be plotted on a logarithmic scale and normalized to the minimum, which occurs between gratings II and III.

As can be inferred from FIG. 9, all of the nanostructures may provide an enhanced outcoupling compared to the neighboring unpatterned areas. However, the monotonic increase in the depth $d_{etch}$ of the gratings from the first grating II to the last grating VII is associated with a non-monotonic photoluminescence trend. For example, the photoluminescence of gratings II, III, and IV may be comparable but reaches a maximum at grating V before decreasing for gratings VI and VII. The photoluminescence of grating V may be approximately 10× that of the signal detected away from the gratings on the unpatterned flat silver (Ag) film.

Figure 10:
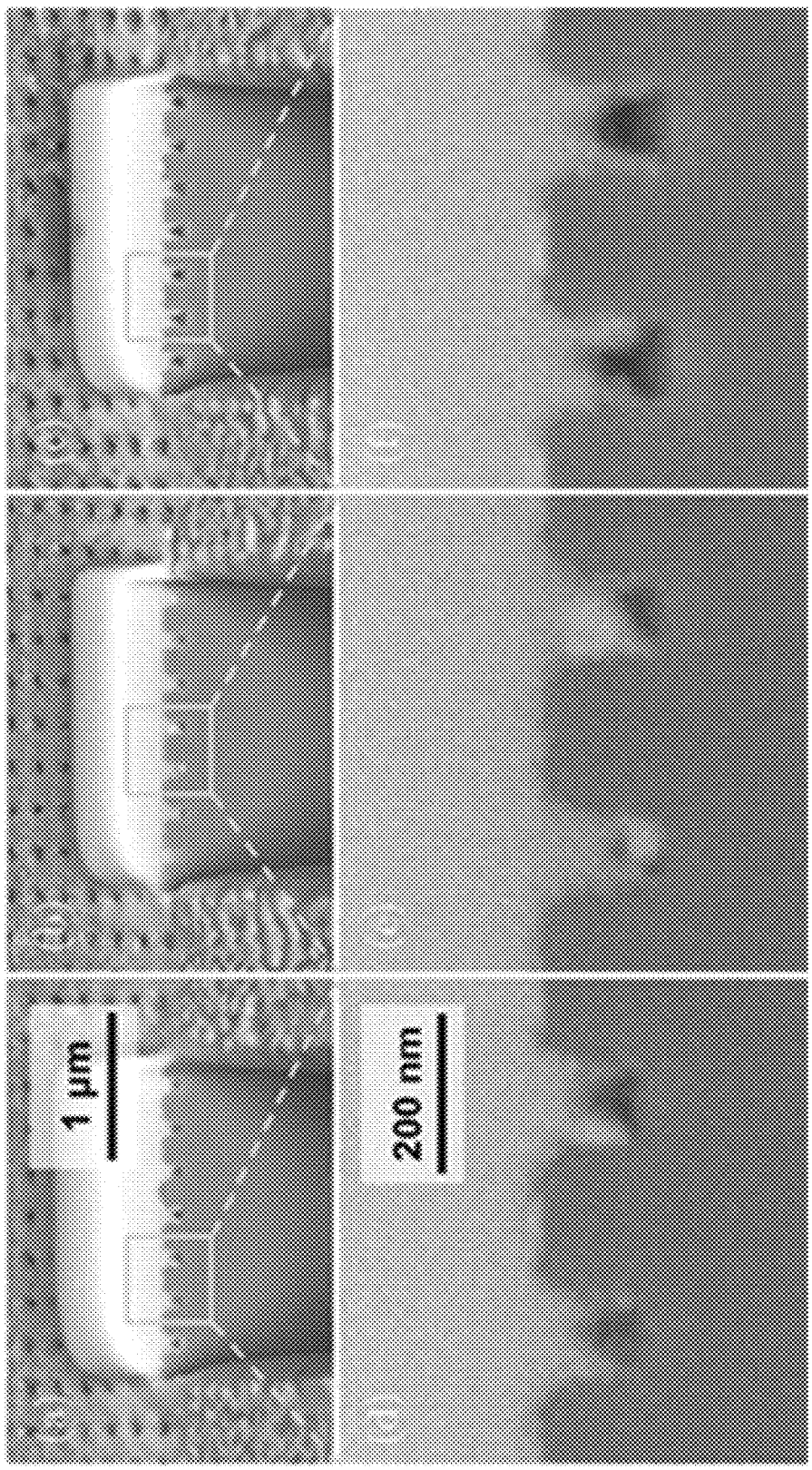
FIG. 10 depicts a cross sectional analysis of nanohole gratings having various depths, in accordance with some example embodiments.

Referring to FIG. 10, the effect of depth $d_{etch}$ of the gratings on the performance of the light emitting diode may be further assessed based on a cross-sectional analysis of the best performing grating V and gratings IV and VI, which have depths that are immediately smaller and larger than grating V. For example, upon completing and verifying photoluminescence characterization of the light emitting diode, a thick (e.g., several hundreds nanometer thick) platinum (Pt) layer may be deposited on a portion of the grating via the electron-assisted chemical vapor deposition (CVD). The platinum (Pt) coating may act to protect the surface of the grating during cutting as well as to ensure optical contrast with the indium gallium nitride and gallium nitride (InGaN/GaN) heterostructure by filling the nanoholes. A vertical cross section may be defined, for example, by means of We then defined by means of a focused ion beam (FIB), along the nanohole diameter. Notably, despite a preliminary optimization of the electron deposition current, a larger than 1:1 aspect ratio of the nanoholes prevents the nanoholes from being completely filled by platinum (Pt). Nevertheless, the bottoms of the nanoholes may still be identified with sufficient accuracy for measuring the depth $d_{etch}$ of the nanoholes.

FIG. 10(a) depicts a scanning electron microscope (SEM) image at a 52° tilt of backscattered electrons (BSE) of a portion of grating IV. Scanning electron microscope images of backscattered electrons of a portion of gratings V and VI are shown, respectively, in FIGS. 10(b) and 10(c). The gratings shown in FIGS. 10(a)-(c) may be cross-sectioned via focused ion beam (FIB) to measure depth $d_{etch}$. The cut area and its surroundings exhibit the damage caused to the grating region by the photoluminescence mapping. A platinum (Pt) film may be deposited via electron-assisted chemical vapor deposition (CVD) prior to the cut in order to protect the grating surface and ensure optical contrast for the hole cross-section. FIGS. 10(d)-(f) depicts, respectively, scanning electron images at a 52° tilt of the backscattered electron (BSE) of gratings IV, V, and VI. Due to the aspect ratio being larger than 1:1, the platinum (Pt) coating may only fill each of the gratings partially, leaving at least some voids at the bottom of each grating.

As shown in FIGS. 10(d)-(e), photoablation at the top surface as well as the bottom of the gratings may cause the silver (Ag) to either sublimate or melted and reaggregated in small inclusions. The depth $d_{etch}$ of gratings IV, V, and VI may be in the range 145-155 nanometers, 165-175 nanometers, and 180-185 nanometers, respectively. While it may not be possible to discern between the pGaN region, the multiple quantum well region, and the nGaN region, the thickness of the pGaN region is nevertheless known to be $t_{pGaN}$=130-140 nanometers and the thickness of the multiple quantum well region may be 36 nanometers. Recalling that the thickness of the silver (Ag) film is 20 nanometers, one may conclude that photoluminescence intensity may be maximized when there is overlap between the silver (Ag) nanodisk inclusions at the bottom of the gratings and the multiple quantum well (MQW) volume.

Further insight may be gained by analyzing the multiple quantum well (MQW) nanostructured plasmonic film coupling by means of 3-dimensional finite element simulations (e.g., Comsol Multiphysics). The periodicity of the grating may be modeled with periodic boundary conditions. The unit cell of the grating, with a pitch $p_h$=300 nanometers, may contain a gallium nitride (GaN) block, patterned with a nanohole grating having a fixed diameters of $d_h$=120 nanometers and variable depths $d_{etch}$. The gallium nitride (GaN) surface and the bottom of the gratings may be coated with a 20 nanometer thick silver (Ag) film.

The multiple quantum well (MQW) emission may be modeled with an electric dipole, fixed at a vertical distance $d_{es}$=140 nanometers from the gallium nitride (GaN) surface and at a horizontal distance $d_{eh}$=10 nanometers from the grating. The depth $d_{etch}$ of the gratings may be varied progressively from a value that is smaller than the vertical distance $d_{es}$ to a value that is larger than the vertical distance $d_{es}$ from a smaller value than $d_{es}$ to a larger one, while all other geometric parameters remain fixed. The power emitted by the dipole-nanostructure system through the bottom of the simulation domain may be collected. Radiative enhancement (RE) may be defined as the collected power normalized to the power detected in the absence of nanostructures, namely, for a dipole embedded in a bulk gallium nitride (GaN) block with a flat, unpatterned silver (Ag) film on top.

FIG. 11 depicts a simulated interaction between a quantum emitter (e.g., a point dipole) and a silver (Ag) plasmonic grating in gallium nitride (GaN), in accordance with some example embodiments. In FIG. 11(a), radiative enhancement (RE) is plotted as a function of the depth $d_{etch}$ of the grating, with each data point obtained from an equally weighted average over the three Cartesian dipole orientations. As shown in FIG. 11(a), the largest radiative enhancement is observed at depths $d_{etch}$ of 150 nanometers, 155 nanometers, and 160 nanometers, where the horizontal overlap between the dipole and the silver (Ag) nanodisk inclusion is maximized. FIG. 5(b) depicts a comparison of the power distribution of the simulated dipole-nanostructure system at three different etching depths and for the three Cartesian dipole orientations. At a depth $d_{etch}$ shorter than the vertical distance $d_{es}$ (e.g., $d_{etch}$=120 nanometers) and at a depth $d_{etch}$ longer than the vertical distance $d_{es}$ (e.g., $d_{etch}$=180 nanometers), the emitter to silver (Ag) nanodisk coupling may be limited. Contrastingly, at a depth of $d_{etch}$=160 nanometers, where the silver (Ag) nanodisk is adjacent to the dipole, the gain-mode overlap may be maximized, resulting in increased photoluminescence (PL) emission.

In some example embodiments, by separating the volume light emitting diode into "plasmonic" and "electronic" domains, the design of the light emitting diode may enable a simultaneous increase in modulation speed and output intensity, while still preserving an effective diode structure. Spontaneous emission lifetime, which sets the optical limit for the direct modulation bandwidth, may be tuned via grating geometry. For example, a shorter lifetime may be achieved by shortening the pitch $p_h$ of the grating. The diameter $d_h$ of the grating does not impact emission lifetime significantly when the depth of $d_{etch}$ of the grating is shallow but a larger radius $d_h$ may be associated with a reduced emission lifetime for a deeper grating.

In some example embodiments, interdependence may also exist grating geometry and the thickness $t_{pGaN}$ of the pGaN layer. As noted, the thickness $t_{pGaN}$ of the pGaN layer must be larger than the depletion width of the light emitting diode to provide a satisfactory carrier injection into the multiple quantum wells (MQW). However, an arbitrary increase in the thickness $t_{pGaN}$ of the pGaN may be thwarted by nanofabrication limitations. For example, to maximize light extraction, the bottom of the gratings should reach below the vertical location of the multiple quantum wells, such that the overlap between the plasmonic film and the emitting volume reaches a maximum. By constraining the depth $d_{etch}$ of the grating, the thickenss $t_{pGaN}$ of the pGaN layer may impose a practical limit also on the diameter $d_h$ and the pitch $p_h$ of the grating. As the aspect ratio between the depth $d_{etch}$ and diameter $d_h$ of the grating exceeds 1.5 to 1, the structural integrity of the grating (e.g., straight walls, sharp edges, and/or the like) and the filing of the nanoholes with plasmonic inclusions may become progressively harder to maintain. The structural integrity of the grating may become especially critical when the pitch $p_h$ of the grating in order to avoid adjacent holes from collapsing into one another. Accordingly, the balance between modulation bandwidth, internal quantum efficiency, and injection efficiency of the light emitting diode may be controlled by strategic adjustments to the depth $d_{etch}$, the diameter $d_h$, and/or the pitch $p_h$ of the grating.

In order to enable direct current modulation, electrical contacts with a ground-signal-ground (GSG) topology, supporting high-speed operation through the minimization of capacitive effects, may be integrated in the light emitting diode. A transparent sapphire substrate may permit light emission from the bottom of the light emitting diode chip such that a gold (Au) pGaN contact may be deposited on top of the plasmonic grating to further increase radiation extraction by acting as a mirror. Alternatively, a transparent indium tin oxide (ITO) contact may be adopted maximize photoluminescence (PL) emission. If a contact is deposited directly on the plasmonic grating, the filled holes volume may become a preferential path for current, due to its larger conductivity compared to the pGaN layer. The poor injection efficiency of the "electronic" regions and the shorting of the "plasmonic" ones may hamper the functioning of the light emitting diode. This may be avoided by coating a thin (e.g., few nanometer thick) oxide insulation layer inside the nanoholes prior to depositing the plasmonic film. Doing so may preserve the horizontal overlap between the silver (Ag) inclusions with the multiple quantum well (MQW) region but current flow may be confined to the "electronic" regions to preserve proper diode structure. To obtain conformal protection of the bottom and the internal walls of the nanoholes, a silicon dioxide ($SiO_2$) layer and/or an aluminium oxide ($Al_2O_3$) may be grown by atomic layer deposition (ALD), followed by directional dry etching of the surface of the light emitting diode to remove the oxide coating from the top of the "electronic" regions, which would otherwise prevent efficient contact.

An alternative approach to the integration of plasmonic nanostructures in an indium gallium nitride and gallium nitride (InGaN/GaN) light emitting diode may include inserting silver (Ag) nanoparticles into the light emitting diode structure. However, this technique may require breaking the vacuum in the growth chamber to e-beam evaporate the metallic particles, which may introduce impurities within the heterostructure. Moreover, the roughness induced by the silver (Ag) particles may propagate to the layers deposited on top of the particles to create lattice crystallinity in the multiple quantum well (MQW) region as well as in the pGaN layer. Thus, to preserve the planarity of the light emitting diode structure, the geometry of the plasmonic grating should enable accurate and precise production, even at high volumes. Low throughput techniques such as focused ion beam (FIB) milling (which can also cause ion implantation in the light emitting diode crystal lattice) or e-beam lithography may therefore be unsuitable. By contrast, large-scale, large-area alternatives, such as nanoimprint lithography (NIL) or direct laser writing lithography may be suitable for high throughput fabrication.

As noted, in some example embodiments, an indium gallium nitride and gallium nitride (InGaN/GaN) light emitting diode with a silver (Ag) nanohole grating (PLED) may be especially suitable for high speed, high efficiency applications such as optical communication. For example, the indium gallium nitride and gallium nitride (InGaN/GaN) light emitting diode with the silver (Ag) nanohole grating may be used to implement blue light emitting diode transmitters in a visible light communication (VLC) system. To increase the quantity of wavelength channels, it may be possible to engineer indium gallium nitride (InGaN) emission (limitedly to the UV-blue-green spectral region) or use a different semiconductor platform (for the red-infrared region). However, owing to its fixed plasmonic properties, silver (Ag) effectively enhances the modulation bandwidth only at blue frequencies. Substitution of the silver (Ag) film with a multilayer hyperbolic MM allows the wavelength to be tuned for maximum lifetime reduction across the remainder of the light spectrum. For example, a silver (Ag) and silicon (Si) multilayer may red-shift the plasmonic resonance monotonically, depending on the quantity of silicon (Si), to allow for peak bandwidth enhancements at green as well as red frequencies.

In some example embodiments, the density of information on a monochromatic light emitting diode channel may be increased by encoding, in the emitted light, two different polarizations. To this end, the nanohole grating may be replaced with chiral plasmonic metasurfaces, patterned with spiral features that induce a right-handed or a left-handed circular polarization. Compared with linear polarization, circular polarization may exhibit a higher degree of persistence in scattering environments, and may therefore be more suitable for visible light communication (VLC). In addition to encoding spin angular momentum (right- or left-handedness) with plasmonic metasurfaces, orbital angular momentum (OAM), related to the helicoidal shaping of the emitted wavefront, may also be encoded with plasmonic metasurfaces. Orbital angular momentum (OAM) may be associated with a quantum number, which may assume any integer value from 0 to infinity and thus providing, for a given light frequency, a number of information channels that is, in principle, unlimited.

In some example embodiments, the volume of a blue indium gallium nitride and gallium nitride (InGaN/GaN) light emitting diode (LED) with a nanostructured film that includes a nanohole grating coated with silver (Ag) may include may be decoupled into a "plasmonic" region and an "electronic" region. In doing so, the light emitting diode may be simultaneously capable of a higher modulation speed relative to a conventional light emitting diode as well as increased light output relative to a plasmonic light emitting diode having a flat, unpatterned silver (Ag) film, all while preserving an effective diode structure (e.g., p-i-n junction). In order to optimize light extraction, six plasmonic gratings with identical pitch $p_h$, identical diameter $d_h$, and variable depth $d_{etch}$ was fabricated. Time-resolved photoluminescence (PL) measurements at the peak emission wavelength $\lambda_0=450$ nm indicated an almost 40-fold enhancement in the limit 3 dB modulation bandwidth for all six gratings.

A spatial mapping of the photoluminescence intensity at the wavelength $\lambda_0=450$ nm, combined with a cross-sectional analysis of the fabricated structures, revealed that light extraction may be maximized when the silver (Ag) nanodisk inclusions inside the nanoholes overlap with the multiple quantum well (MQW) volume, rather than sitting above or below it. An interdependence exists between the thickness $t_{pGaN}$ of the pGaN layer and various geometric parameters of the grating. Moreover, including an insulation layer inside the nanoholes may be necessary to enable effective electrooptical performance.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A light emitting diode, comprising:
a light emission layer;
a first charge transport layer disposed on the light emission layer; and
a grating comprising a plurality of nanoholes formed by a removal process and a deposition process, the removal process comprising removing a first portion of the first charge transport layer and by removing a second portion of the light emission layer, the deposition process comprising depositing a plasmonic metamaterial within recesses formed into the first charge transport layer and the light emission layer by the removal process, the plurality of nanoholes serving as optical antennas distributed according to a pattern to focus light emitted by the light emission layer, the plurality of nanoholes comprising a first type of nanostructures less than a threshold distance away from a sidewall of the light emitting diode, and the plurality of nanoholes comprising a second type of nanostructures more than the threshold distance away from the sidewall, wherein the second type of nanostructures are different from the first type of nanostructures.

2. The light emitting diode of claim 1, wherein the plasmonic metamaterial comprises a layer of a metal or a multilayer of the metal and at least one of a dielectric and a semiconductor, wherein the threshold distance is a single diffusion length away from the sidewall, and wherein the single diffusion length corresponds to an average distance traveled by a carrier in the light emitting diode.

3. The light emitting diode of claim 1, wherein the second type of nanostructures are different from the first type of nanostructures with respect to a material composition, a shape, a dimension, a placement, and/or a distribution.

4. The light emitting diode of claim 1, wherein a diameter, a pitch, and/or a depth of the plurality of nanoholes are configured to optimize a quantum efficiency of the light emitting diode.

5. The light emitting diode of claim 4, wherein the depth and the diameter of the plurality of nanoholes have an aspect ratio of less than 1.5 to 1.

6. The light emitting diode of claim 1, wherein the plurality of nanoholes are patterned through the first charged transport layer to the light emission layer before being coated in the plasmonic metamaterial.

7. The light emitting diode of claim 6, wherein the plasmonic metamaterial inside the plurality of nanoholes are configured to horizontally overlap with the light emission layer.

8. The light emitting diode of claim 1, wherein the light emitting diode comprises a plasmonic region occupied by the plurality of nanoholes, and wherein the light emitting diode further comprises an electronic region free from the nanoholes.

9. The light emitting diode of claim 8, wherein a thickness of the first charge transport layer is configured to preserve a diode behavior of the electronic region.

10. The light emitting diode of claim 1, wherein the light emitting diode comprises a transmitter in a visible light communication system.

11. The light emitting diode of claim 1, wherein the light emitting diode is less than 100 microns in size.

12. The light emitting diode of claim 1, wherein the light emitting diode is between 0.1 microns and 10 microns in size.

13. The light emitting diode of claim 1, wherein the plurality of nanoholes are further formed by removing a portion of the light emission layer and depositing the plasmonic metamaterial inside the recesses formed in the remaining portion of the light emission layer.

14. The light emitting diode of claim 13, wherein the plurality of nanoholes are further formed by depositing at least a portion of the first charge transport layer on top of the plasmonic metamaterial and the remaining portion of the light emission layer.

15. The light emitting diode of claim 1, wherein the one or more protrusions and recesses form one or more channels and/or indentations in the first charge transport layer and/or the light emission layer.

16. The light emitting diode of claim 1, wherein the light emitting diode further comprises a second charge transport layer, a buffer layer, and a substrate, wherein the second charge transport layer is disposed on the substrate, and wherein the buffer layer is interposed between the light emission layer and the second charge transport layer.

17. The light emitting diode of claim 16, wherein the light emitting diode further comprises an isolation layer forming an interface between at least a portion of the plasmonic metamaterial, the first charge transport layer, the light emission layer, and/or the second charge transport layer.

18. The light emitting diode of claim 1, wherein the light emitting diode further comprises one or more contacts and/or bonding pads.

19. The light emitting diode of claim 1, wherein the light emitting diode comprises an indium gallium nitride and gallium nitride (InGaN/GaN) light emitting diode in which the first charge transport layer comprises gallium nitride (GaN) and the light emission layer comprises indium gallium nitride (InGaN).

* * * * *